United States Patent
Koike et al.

(10) Patent No.: US 7,304,384 B2
(45) Date of Patent: Dec. 4, 2007

(54) SEMICONDUCTOR DEVICE WITH A BARRIER FILM WHICH CONTAINS MANGANESE

(75) Inventors: Junichi Koike, Sendai (JP); Makoto Wada, Sendai (JP); Shingo Takahashi, Ebina (JP); Noriyoshi Shimizu, Tama (JP); Hideki Shibata, Yokohama (JP); Satoshi Nishikawa, Hachioji (JP); Takamasa Usui, Tokyo (JP); Hayato Nasu, Yokohama (JP); Masaki Yoshimaru, Hachioji (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 0 days.

(21) Appl. No.: 11/063,876

(22) Filed: Feb. 24, 2005

(65) Prior Publication Data

US 2005/0218519 A1    Oct. 6, 2005

(30) Foreign Application Priority Data

Feb. 27, 2004   (JP)   ............................. 2004-053458
Feb.  3, 2005   (JP)   ............................. 2005-027756

(51) Int. Cl.
*H01L 23/48* (2006.01)
*H01L 23/52* (2006.01)
*H01L 29/40* (2006.01)

(52) U.S. Cl. ...................................... 257/751; 257/762
(58) Field of Classification Search ......... 257/750–774
See application file for complete search history.

(56) References Cited

U.S. PATENT DOCUMENTS 6,664,185 B1 * 12/2003 Wang et al. ................. 438/659
6,706,629 B1 *  3/2004 Lin et al. .................... 257/750
7,078,336 B2 *  7/2006 Cheng et al. ............... 438/637
2005/0218519 A1  10/2005 Koike et al.

FOREIGN PATENT DOCUMENTS

| | | |
|---|---|---|
| JP | 2-62035 | 3/1990 |
| JP | 5-47760 | 2/1993 |
| JP | 8-115914 | 5/1996 |
| JP | 8-139092 | 5/1996 |
| JP | 11-54458 | 2/1999 |
| JP | 11-87349 | 3/1999 |
| JP | 2001-44156 | 2/2001 |
| JP | 2005-277390 | 10/2005 |
| KR | 10-0203536 | 3/1993 |
| KR | 2002-0026568 | 4/2002 |
| WO | WO 01/13415 A1 | 2/2001 |

OTHER PUBLICATIONS

U.S. Appl. No. 11/476,596, filed Jun. 29, 2006, Nasu, et al.
"Kagaku Binran Basic II" edited by The Chemical Society of Japan (issued by Maruzen Co., Ltd. On Aug. 20, 1970, third edition), pp. 1132-1133.
W. A. Lanford, et al., "Low-temperature passivation of copper by doping with Al or Mg", Thin Solid Films, vol. 262, 1995, pp. 234-241.

* cited by examiner

*Primary Examiner*—Cuong Nguyen
(74) *Attorney, Agent, or Firm*—Oblon, Spivak, McClelland, Maier & Neustadt, P.C.

(57) ABSTRACT

A semiconductor device includes an interlevel insulating film disposed on a semiconductor substrate and having an opening formed therein. An interconnection main layer, which contains Cu as a main component, is embedded in the opening. A barrier film is interposed between the interlevel insulating film and the interconnection main layer within the opening. The barrier film contains, as a main component, a compound of a predetermined metal element with a component element of the interlevel insulating film.

15 Claims, 14 Drawing Sheets

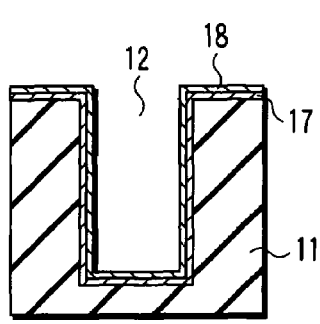
F I G. 4A
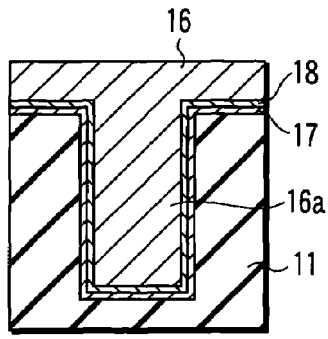
F I G. 4B
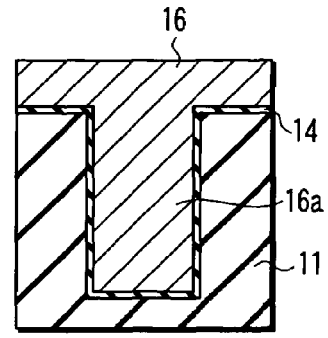
F I G. 4C
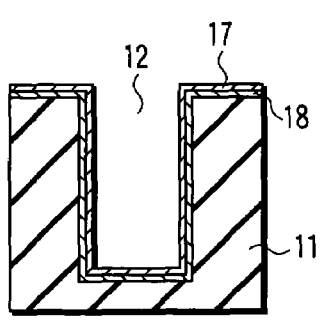
F I G. 5A
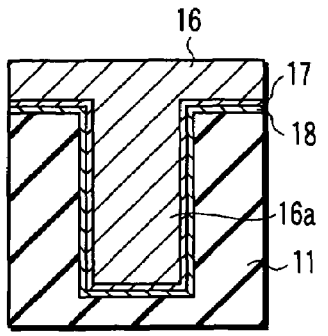
F I G. 5B
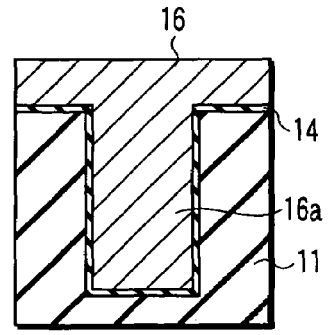
F I G. 5C
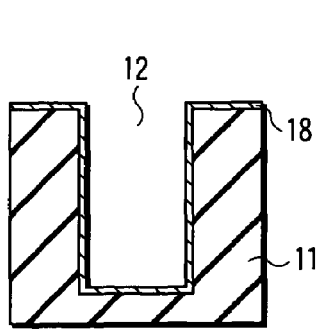
F I G. 6A
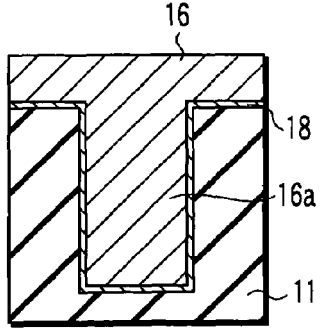
F I G. 6B
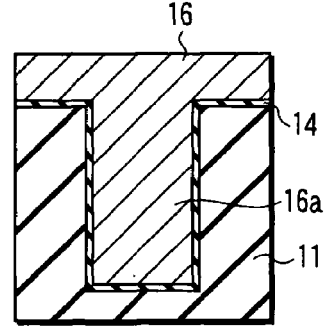
F I G. 6C

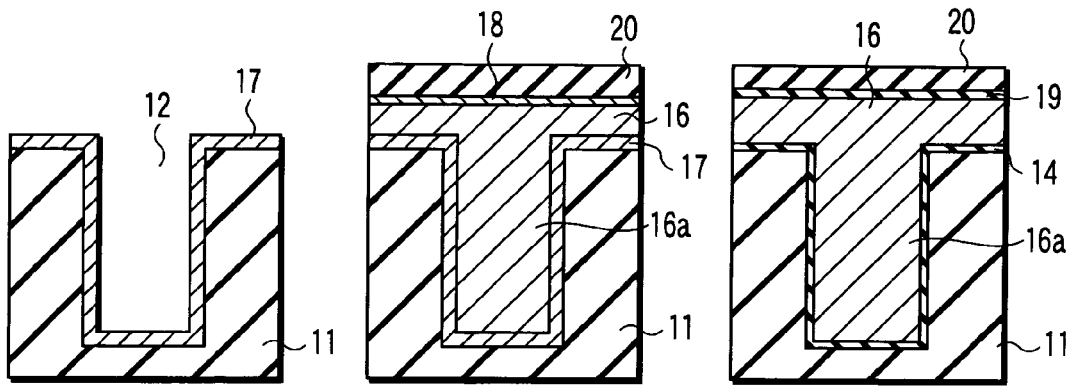
F I G. 13A    F I G. 13B    F I G. 13C
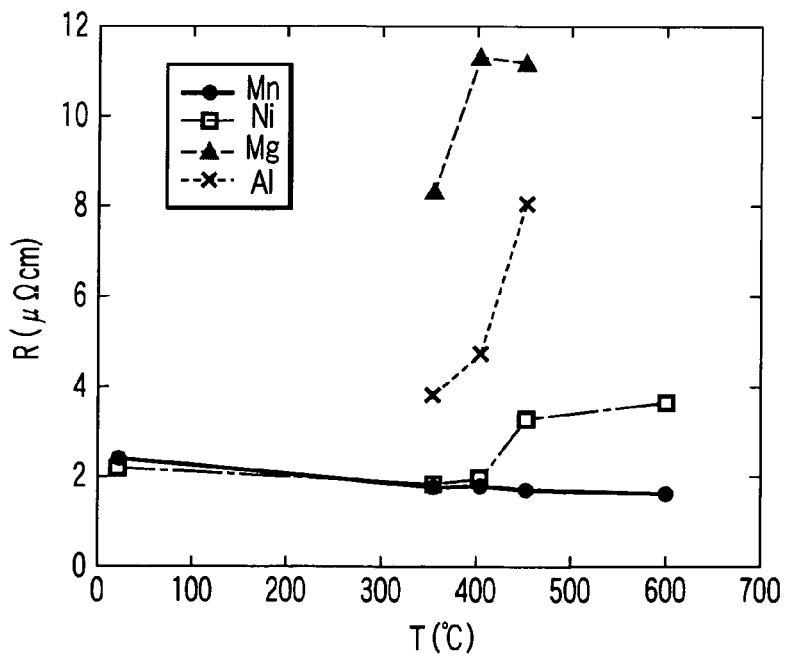
F I G. 14

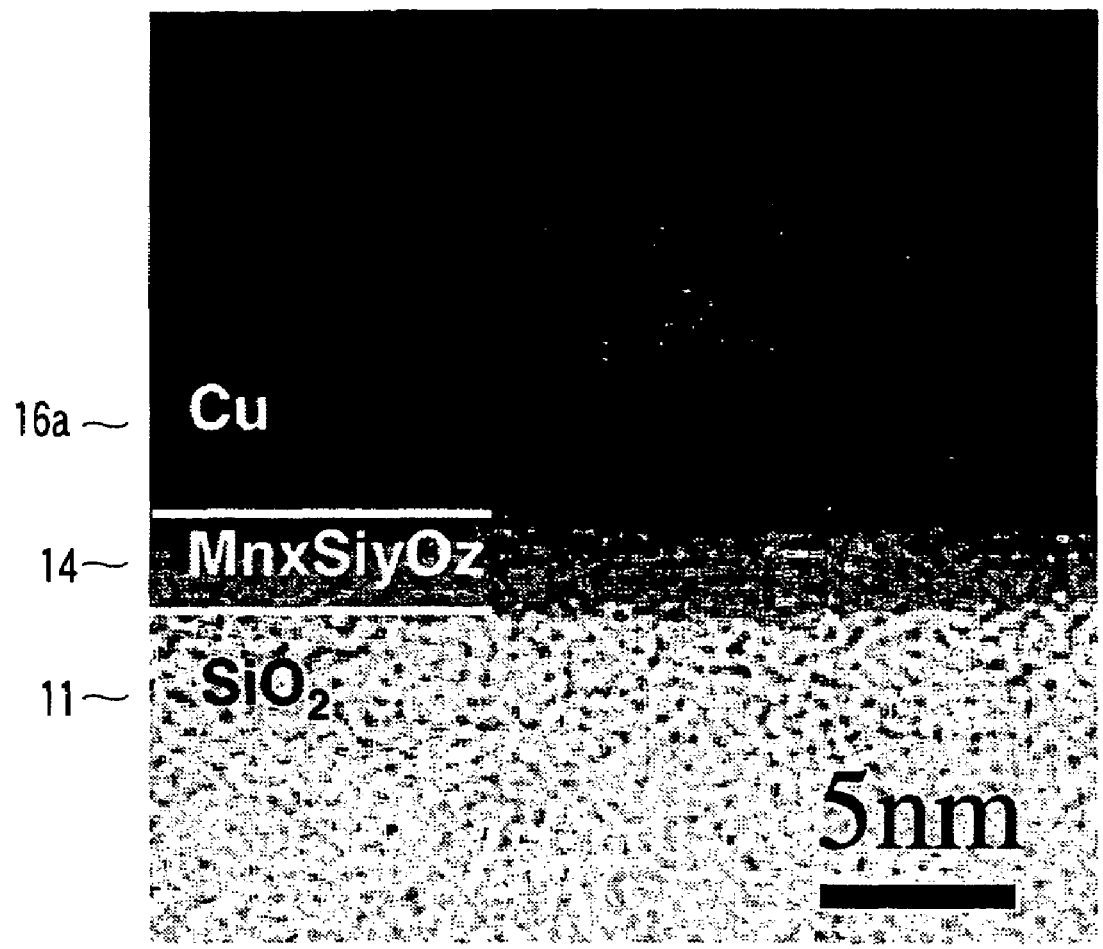
F I G. 15

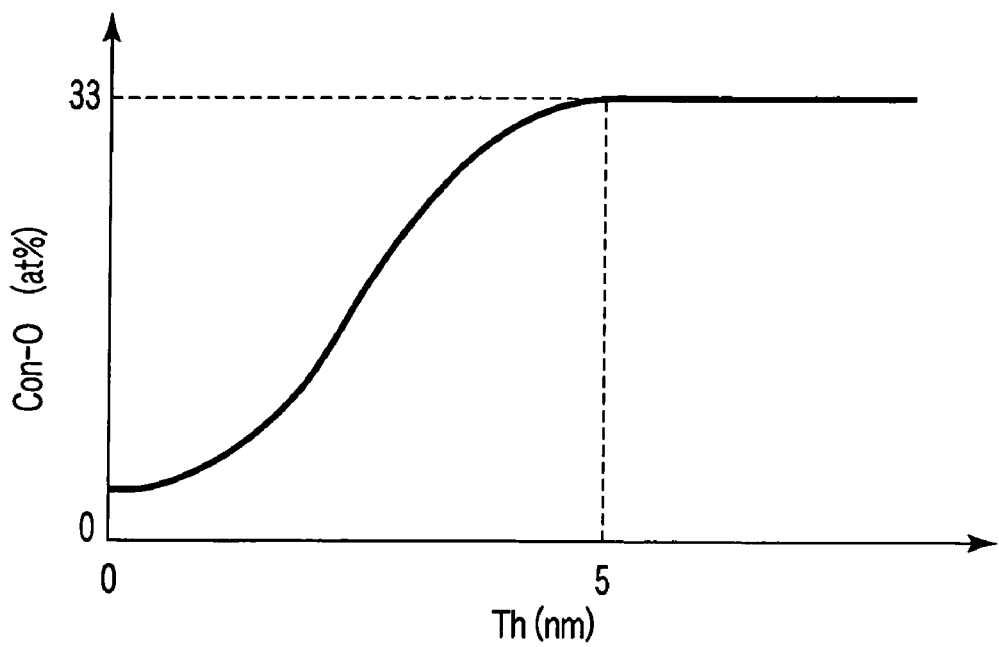
F I G. 21
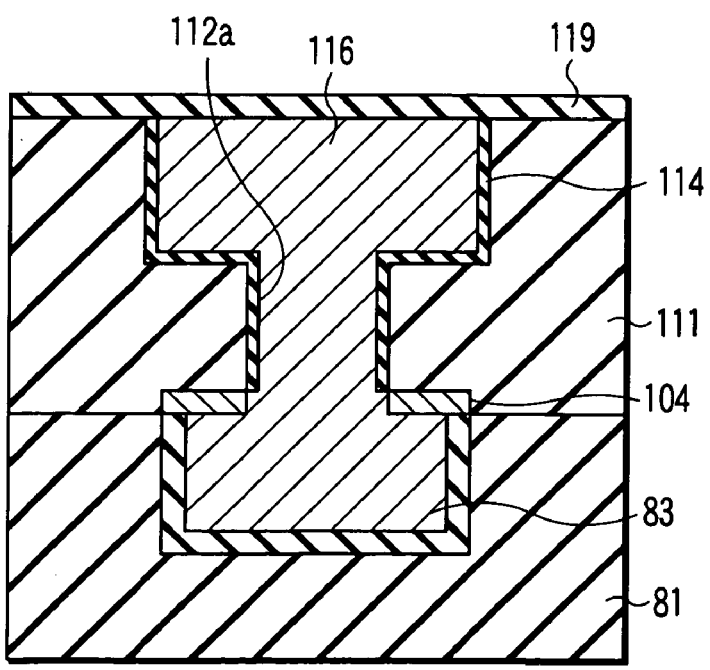
F I G. 23

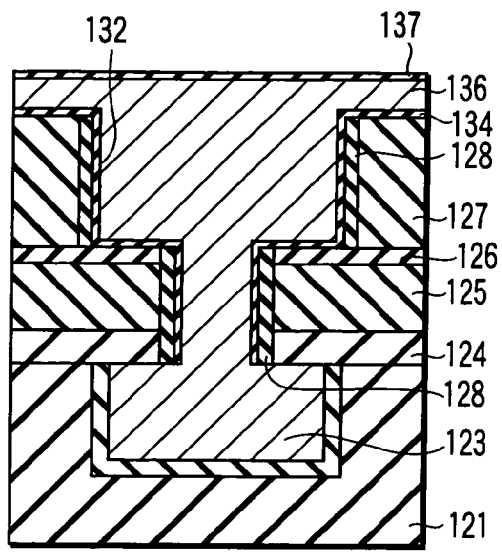 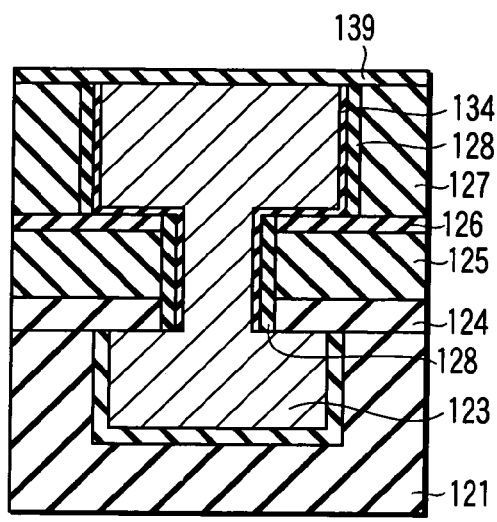
FIG. 24E   FIG. 24F
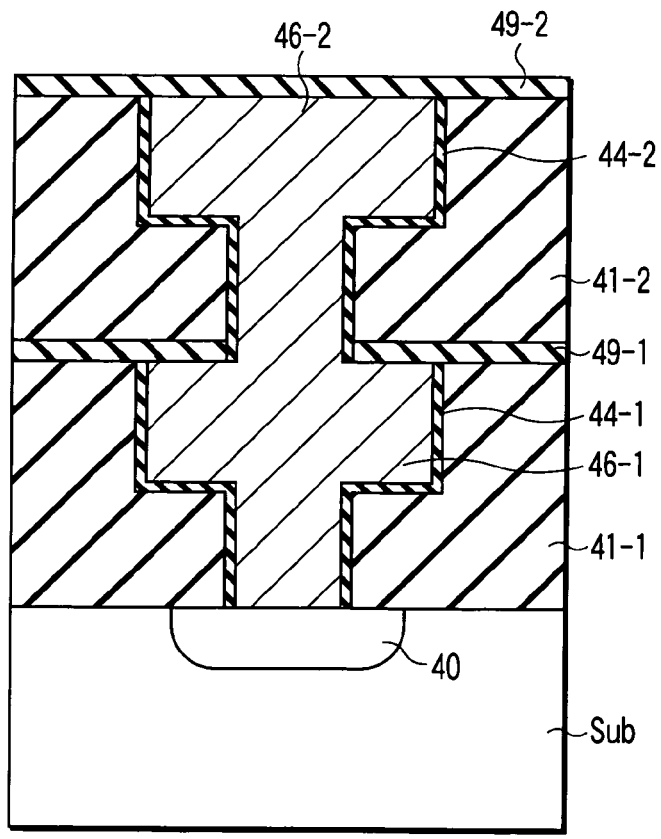
FIG. 25

SEMICONDUCTOR DEVICE WITH A BARRIER FILM WHICH CONTAINS MANGANESE

CROSS-REFERENCE TO RELATED APPLICATIONS

This application is based upon and claims the benefit of priority from prior Japanese Patent Applications No. 2004-053458, filed Feb. 27, 2004; and No. 2005-027756, filed Feb. 3, 2005, the entire contents of both of which are incorporated herein by reference.

BACKGROUND OF THE INVENTION

1. Field of the Invention

The present invention relates to a semiconductor device including an interconnection, which has an interconnection main layer containing Cu (copper) as the main component (i.e., by 50% or more), wherein such an interconnection will be also referred to as a Cu interconnection, for the sake of convenience. The present invention also relates to a semiconductor device manufacturing method for forming such an interconnection by a barrier self-formation process. Particularly, the present invention relates to a semiconductor device and manufacturing method thereof, utilizing a damascene interconnection structure.

2. Description of the Related Art

In recent years, interconnection structures employing Cu and an insulating film with a low dielectric constant have been developed to increase the speed and integration degree of silicon (Si) semiconductor integrated circuits. Where a Cu interconnection structure is used for an integrated circuit, the Cu interconnection easily causes counter diffusion relative to an insulating layer around it, or easily causes a reaction in an oxygen atmosphere and produces a Cu oxide film, during various heat treatments used for manufacturing the integrated circuit. In order to prevent these problems, it is necessary to form a diffusion barrier film, such as a tantalum (Ta) or tantalum nitride (TaN) film, before the Cu layer (interconnection main layer) is formed. Particularly, where an embedded Cu layer is formed in an interlevel insulating film, as in a damascene interconnection structure, Cu diffusion into the insulating film becomes prominent, and thus a diffusion barrier film is indispensable.

In order to ensure that Cu interconnection structures are reliable, they need to have a barrier film with a thickness of 10 nm or more, under the present process technique. However, barrier films are required to be thinner with generation changes to reduce the interconnection resistance, because the interconnection width will decrease, thereby increasing the resistance. In this respect, conventional barrier film formation methods entail some difficulties in depositing a barrier film on the side surface of an interconnection groove or via-hole (interconnection hole) with uniform thickness and quality. As a consequence, it is difficult to ensure a required barrier property level of the barrier film, the adhesiveness at the interface between the barrier film and Cu layer, and the resistance against electro migration due to interface diffusion, thereby causing problems in reliability.

As an ultimate arrangement to solve these problems while reducing the thickness of the barrier film, a barrier-less structure, which does not include any conventional barrier film formation process, is conceivable. It has been proposed, as a method of forming a barrier-less structure, to add an alloy element in a Cu layer and perform a heat treatment on the Cu layer, so as to diffuse the alloy element to the interface between the Cu layer and an insulating layer, at which the alloy element reacts with the insulating layer and thereby forms a stable compound.

Major elements reported so far to be usable as the alloy element described above are Al, Mg, and Sn. However, these elements greatly increase the electric resistance, while there is no report saying that they form a stable compound at the interface. Accordingly, under the present circumstances, a barrier-less structure is expected as an ultimate interconnection structure, but is considered to be very difficult to achieve. In this respect, although a barrier-less structure was included in loadstars for the future on the roadmap of ITRS (International Technology Roadmap for Semiconductor) in 1999, it was excluded therefrom in 2001.

As described above, conventionally, where an interconnection structure employs a Cu interconnection formed in an interlevel insulating film, a barrier film is required to ensure the reliability of the structure. However, the presence of the barrier film brings about problems, such as an increase in interconnection resistance, and a decrease in interconnection reliability. On the other hand, although a barrier-less structure is expected as an ultimate interconnection structure, such a structure is very difficult to achieve. Accordingly, it is desired to provide a semiconductor device and manufacturing method thereof which can improve the reliability of an interconnection structure and decrease the interconnection resistance.

The following publications disclose techniques relating to the present invention:

[Patent publication 1]
Jpn. Pat. Appln. KOKAI Publication No. 2-62035
[Non-patent publication 1]
W. A. Lanford et al., Thin Solid Films, 262 (1995) 234-241

BRIEF SUMMARY OF THE INVENTION

According to a first aspect of the present invention, there is provided a semiconductor device comprising:

an interlevel insulating film disposed on a semiconductor substrate and having an opening formed therein;

an interconnection main layer embedded in the opening and containing Cu as a main component; and a barrier film interposed between the interlevel insulating film and the interconnection main layer within the opening, the barrier film containing, as a main component, a compound of a predetermined metal element with a component element of the interlevel insulating film.

According to a second aspect of the present invention, there is provided a method of manufacturing a semiconductor device, comprising:

forming an opening in an interlevel insulating film disposed on a semiconductor substrate;

forming an auxiliary film containing a predetermined metal element, to cover an inner surface of the opening;

forming a main film to fill the opening after forming the auxiliary film, the main film containing, as a main component, Cu used as a material of an interconnection main layer; and performing a heat treatment before or after forming the main film, thereby diffusing the predetermined metal element of the auxiliary film onto a surface of the interlevel insulating film facing the auxiliary film, so as to form a barrier film on the interlevel insulating film within the opening, the barrier film containing, as a main component, a compound of the predetermined metal element with a component element of the interlevel insulating film.

According to a third aspect of the present invention, there is provided a method of manufacturing a semiconductor device, comprising:

forming an opening in an interlevel insulating film disposed on a semiconductor substrate;

forming a main film to fill the opening, the main film containing, as a main component, Cu used as a material of an interconnection main layer;

forming an auxiliary film containing a predetermined metal element on the main film after forming the main film; and performing a heat treatment after forming the auxiliary film, thereby diffusing the predetermined metal element of the auxiliary film onto a surface of the interlevel insulating film facing the main film, so as to form a barrier film on the interlevel insulating film within the opening, the barrier film containing, as a main component, a compound of the predetermined metal element with a component element of the interlevel insulating film.

BRIEF DESCRIPTION OF THE SEVERAL VIEWS OF THE DRAWING

FIGS. 4A to 4C are sectional views showing the basic arrangement of sequential steps of a semiconductor device manufacturing method according to a fourth embodiment of the present invention;

FIGS. 5A to 5C are sectional views showing the basic arrangement of sequential steps of a semiconductor device manufacturing method according to a fifth embodiment of the present invention;

FIGS. 6A to 6C are sectional views showing the basic arrangement of sequential steps of a semiconductor device manufacturing method according to a sixth embodiment of the present invention;

FIGS. 13A to 13C are sectional views showing the basic arrangement of sequential steps of a semiconductor device manufacturing method according to a thirteenth embodiment of the present invention;

FIG. 14 is a view showing characteristics of various Cu alloys, in terms of change in resistivity relative to heat treatment temperature;

FIG. 15 is a view showing a TEM micrographic image of a cross section of a semiconductor device manufactured by the first embodiment;

FIG. 21 is a graph showing the oxygen concentration distribution in a diffusion prevention film according to a modification of the seventeenth embodiment;

FIG. 23 is a sectional view showing a semiconductor device according to a modification of the eighteenth embodiment;

FIGS. 24A to 24F are sectional views showing sequential steps of a semiconductor device manufacturing method according to a nineteenth embodiment of the present invention; and FIG. 25 is a sectional view showing a semiconductor device according to a modification of the fourteenth embodiment.

DETAILED DESCRIPTION OF THE INVENTION

Figure 1A:
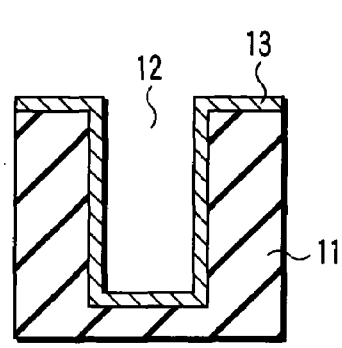
FIGS. 1A to 1C are sectional views showing the basic arrangement of sequential steps of a semiconductor device manufacturing method according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

According to the following embodiments of the present invention, a barrier film for preventing Cu diffusion is formed by means of self alignment between an interconnection main layer containing Cu as the main component (i.e., by 50% or more) and an interlevel insulating film. This barrier film contains a compound of a predetermined metal element α with a component element of the interlevel insulating film. The predetermined metal element α may comprise at least one element selected from the group consisting of Mn, Nb, Zr, Cr, V, Y, Tc, and Re, and preferably comprise Mn.

The metal elements listed above to be usable as the predetermined metal element α have the following advantages, as compared to Ti and Ta, which are used for conventional barrier films, and Al, Mg, and Sn, which have been proposed by conventional barrier-less process techniques. Specifically, the metal elements listed above for the metal element α can easily form an oxide and the oxide is high in affinity with interlevel insulating films. Accordingly, they can provide a stable oxide layer with uniform quality and very small thickness between an interconnection main layer and an interlevel insulating film. Further, since these elements tend to precipitate or form a compound, rather than staying as solid solution in Cu, they do not increase the interconnection resistance.

The interlevel insulating film may comprise O and at least one element selected from the group consisting of Si, C, and F. More specifically, the interlevel insulating film may be made of $SiO_2$, $SiO_xC_y$, $SiO_xC_yH_z$, or $SiO_xF_y$. The barrier film may contain, as the main component, a material selected from the group consisting of $\alpha_xO_y$, $\alpha_xSi_yO_z$, $\alpha_xC_yO_z$, and $\alpha_xF_yO_z$, where $\alpha$ denotes the predetermined metal element $\alpha$ described above.

Figure 1B:
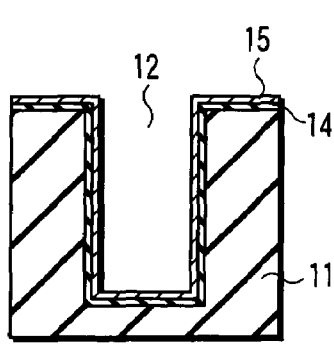
Figure 1C:
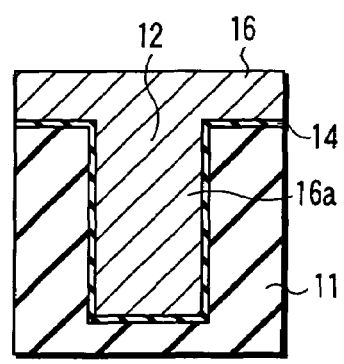

A set of FIGS. 1A to 1C to a set of FIGS. 13A to 11 respectively show semiconductor device manufacturing methods according to different embodiments of the present invention, by sectional views showing the basic arrangement of sequential steps thereof. For the sake of simplicity, the following explanation on these embodiments will be given such that the material of an interconnection main layer is Cu, the metal element $\alpha$ for a barrier film is Mn, and the material of the barrier film is MnO. The composition of the barrier film is simply referred to as MnO in consideration of the function of preventing Cu diffusion and for the sake of convenience, although it can be expressed more properly by $Mn_xSi_yO_z$ (x:y:z=1:1:3 to 1:3:5), as shown in FIG. 15.

First Embodiment

As shown in FIG. 1A, an interconnection groove (opening) 12 is formed in an interlevel insulating film 11 made of $SiO_2$. Then, an alloy film 13 made of Cu and Mn (auxiliary film containing a predetermined metal element $\alpha$) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage). The alloy film 13 works as a seed layer for forming a Cu main film by electrolytic plating described later.

Then, a heat treatment is performed on the structure shown in FIG. 1A, at a temperature of 200 to 400° C. for 5 to 30 minutes, e.g., at 300° C. for 5 minutes. With this operation, Mn in the alloy film 13 is supplied with a force in directions to remove it from Cu, and thereby diffuses onto the surface of the interlevel insulating film 11 facing the alloy film 13. Mn thus supplied from the alloy film 13 reacts with O used as a component element of the interlevel insulating film 11. As a consequence, as shown in FIG. 1B, a barrier film 14 containing, as the main component, a very stable compound or oxide made of MnO is formed by means of self alignment to cover the inner surface of the interlevel insulating film 11, and have a thickness of 5 nm or less, e.g., 2 nm. At this time, the portion of the alloy film 13 on the reverse side to the interlevel insulating film 11 is transformed into a Cu film 15 with a low Mn content.

Then, as shown in FIG. 1C, a Cu main film 16 used as the material of an interconnection main layer is formed by electrolytic plating to fill the interconnection groove 12 with a Cu layer 16a. Thereafter, although not shown, the portion of the Cu main film 16 outside the interconnection groove 12 is polished and removed by a planarization process, such as CMP (Chemical Mechanical Polishing), so that the interconnection main layer formed of the Cu layer 16a and having a low resistance is left in the interconnection groove 12.

Second Embodiment

Figure 2A:
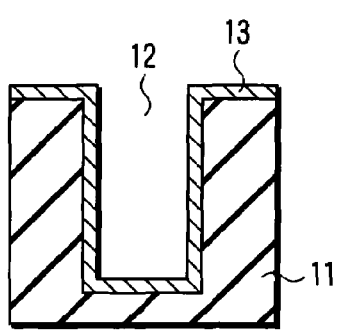
FIGS. 2A to 2C are sectional views showing the basic arrangement of sequential steps of a semiconductor device manufacturing method according to a second embodiment of the present invention.

As shown in FIG. 2A, an interconnection groove (opening) 12 is formed in an interlevel insulating film 11 made of $SiO_2$. Then, an alloy film 13 made of Cu and Mn (auxiliary film containing a predetermined metal element $\alpha$) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage).

Figure 2B:
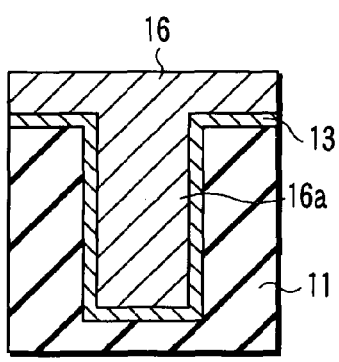

Then, as shown in FIG. 2B, a Cu main film 16 used as the material of an interconnection main layer is formed by electrolytic plating to fill the interconnection groove 12 with a Cu layer 16a. Then, a heat treatment is performed on the structure shown in FIG. 2B, at a temperature of 200 to 400° C. for 5 to 30 minutes, e.g., at 300° C. for 5 minutes.

Figure 2C:
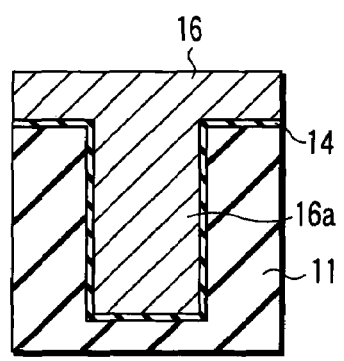

With this operation, Mn in the alloy film 13 diffuses onto the surface of the interlevel insulating film 11 facing the alloy film 13. Mn thus supplied from the alloy film 13 reacts with O used as a component element of the interlevel insulating film 11. As a consequence, as shown in FIG. 2C, a barrier film 14 containing, as the main component, a very stable compound or oxide made of MnO is formed by means of self alignment to cover the inner surface of the interlevel insulating film 11, and have a thickness of 5 nm or less, e.g., 2 nm. At this time, the portion of the alloy film 13 on the reverse side to the interlevel insulating film 11 is essentially integrated with the interconnection main layer formed of the Cu layer 16a.

Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

Third Embodiment

Figure 3A:
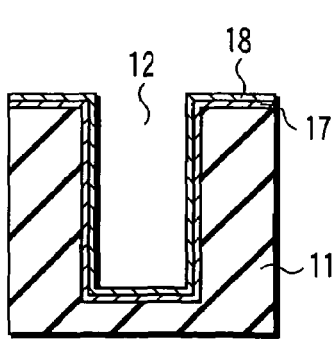
FIGS. 3A to 3C are sectional views showing the basic arrangement of sequential steps of a semiconductor device manufacturing method according to a third embodiment of the present invention.

As shown in FIG. 3A, an interconnection groove (opening) 12 is formed in an interlevel insulating film 11 made of $SiO_2$. Then, a Cu film 17 and a Mn film 18 are formed in this order on the interlevel insulating film 11 to cover the inner surface of the groove 12. The Cu film 17 and Mn film 18 compose an auxiliary film with a multi-layered structure containing a predetermined metal element $\alpha$. The Cu film 17 and Mn film 18 are formed by, e.g., sputtering to have a thickness of 5 to 100 nm and a thickness of 5 to 100 nm, respectively.

Figure 3B:
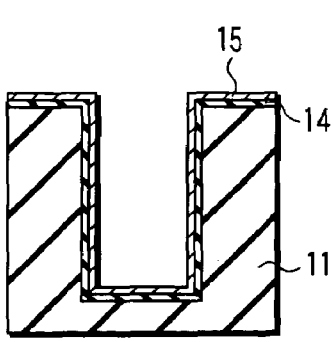

Then, a heat treatment is performed on the structure shown in FIG. 3A, at a temperature of 200 to 400° C. for 5 to 30 minutes, e.g., at 300° C. for 5 minutes. With this operation, Mn in the Mn film 18 diffuses onto the surface of the interlevel insulating film 11 facing the Cu film 17. Mn thus supplied from the Mn film 18 reacts with O used as a component element of the interlevel insulating film 11. As a consequence, as shown in FIG. 3B, a barrier film 14 containing, as the main component, a very stable compound or oxide made of MnO is formed by means of self alignment to cover the inner surface of the interlevel insulating film 11, and have a thickness of 5 nm or less, e.g., 2 nm. At this time, a Cu film 15 with a low Mn content is formed on the side of the barrier film 14 reverse to the interlevel insulating film 11.

Figure 3C:
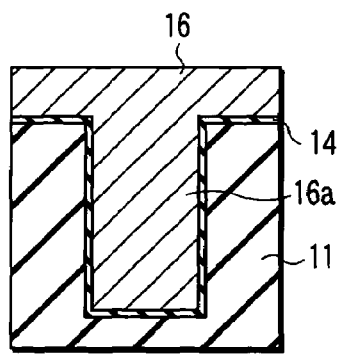

Then, as shown in FIG. 3C, a Cu main film 16 used as the material of an interconnection main layer is formed by electrolytic plating to fill the interconnection groove 12 with a Cu layer 16a. Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

Fourth Embodiment

As shown in FIG. 4A, an interconnection groove (opening) 12 is formed in an interlevel insulating film 11 made of $SiO_2$. Then, a Cu film 17 and a Mn film 18 are formed in this order on the interlevel insulating film 11 to cover the inner surface of the groove 12. The Cu film 17 and Mn film 18 compose an auxiliary film with a multi-layered structure containing a predetermined metal element α. The Cu film 17 and Mn film 18 are formed by, e.g., sputtering to have a thickness of 5 to 100 nm and a thickness of 5 to 100 nm, respectively.

Then, as shown in FIG. 4B, a Cu main film 16 used as the material of an interconnection main layer is formed by electrolytic plating to fill the interconnection groove 12 with a Cu layer 16a. Then, a heat treatment is performed on the structure shown in FIG. 4B, at a temperature of 200 to 400° C. for 5 to 30 minutes, e.g., at 300° C. for 5 minutes.

With this operation, Mn in the Mn film 18 diffuses onto the surface of the interlevel insulating film 11 facing the Cu film 17. Mn thus supplied from the Mn film 18 reacts with O used as a component element of the interlevel insulating film 11. As a consequence, as shown in FIG. 4C, a barrier film 14 containing, as the main component, a very stable compound or oxide made of MnO is formed by means of self alignment to cover the inner surface of the interlevel insulating film 11, and have a thickness of 5 nm or less, e.g., 2 nm.

Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

Fifth Embodiment

As shown in FIG. 5A, an interconnection groove (opening) 12 is formed in an interlevel insulating film 11 made of $SiO_2$. Then, a Mn film 18 and a Cu film 17 are formed in this order on the interlevel insulating film 11 to cover the inner surface of the groove 12. The Mn film 18 and Cu film 17 compose an auxiliary film with a multi-layered structure containing a predetermined metal element α. The Mn film 18 and Cu film 17 are formed by, e.g., sputtering to have a thickness of 5 to 100 nm and a thickness of 5 to 100 nm, respectively.

Then, as shown in FIG. 5B, a Cu main film 16 used as the material of an interconnection main layer is formed by electrolytic plating to fill the interconnection groove 12 with a Cu layer 16a. Then, a heat treatment is performed on the structure shown in FIG. 5B, at a temperature of 200 to 400° C. for 5 to 30 minutes, e.g., at 300° C. for 5 minutes.

With this operation, Mn in the Mn film 18 diffuses onto the surface of the interlevel insulating film 11 facing the Mn film 18. Mn thus supplied from the Mn film 18 reacts with O used as a component element of the interlevel insulating film 11. As a consequence, as shown in FIG. 5C, a barrier film 14 containing, as the main component, a very stable compound or oxide made of MnO is formed by means of self alignment to cover the inner surface of the interlevel insulating film 11, and have a thickness of 5 nm or less, e.g., 2 nm. At this time, the Cu film 17 is essentially integrated with the interconnection main layer formed of the Cu layer 16a.

Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

As a modification of the fifth embodiment, a heat treatment for diffusing Mn may be performed before forming the Cu main film 16, as in the first and third embodiments.

Sixth Embodiment

As shown in FIG. 6A, an interconnection groove (opening) 12 is formed in an interlevel insulating film 11 made of $SiO_2$. Then, a Mn film (auxiliary film containing a predetermined metal element α) 18 is formed on the interlevel insulating film 11 to cover the inner surface of the groove 12. The Mn film 18 is formed by, e.g., sputtering to have a thickness of 5 to 100 nm.

Then, as shown in FIG. 6B, a Cu main film 16 used as the material of an interconnection main layer is formed by electrolytic plating to fill the interconnection groove 12 with a Cu layer 16a. Then, a heat treatment is performed on the structure shown in FIG. 6B, at a temperature of 200 to 400° C. for 5 to 30 minutes, e.g., at 300° C. for 5 minutes.

With this operation, Mn in the Mn film 18 diffuses onto the surface of the interlevel insulating film 11 facing the Mn film 18. Mn thus supplied from the Mn film 18 reacts with O used as a component element of the interlevel insulating film 11. As a consequence, as shown in FIG. 6C, a barrier film 14 containing, as the main component, a very stable compound or oxide made of MnO is formed by means of self alignment to cover the inner surface of the interlevel insulating film 11, and have a thickness of 5 nm or less, e.g., 2 nm.

Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

As a modification of the sixth embodiment, a heat treatment for diffusing Mn may be performed before forming the Cu main film 16, as in the first and third embodiments.

Seventh Embodiment

Figure 7A:
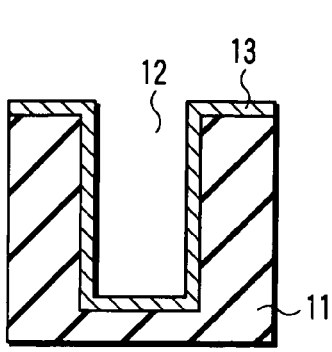
FIGS. 7A to 7C are sectional views showing the basic arrangement of sequential steps of a semiconductor device manufacturing method according to a seventh embodiment of the present invention.

As shown in FIG. 7A, an interconnection groove (opening) 12 is formed in an interlevel insulating film 11 made of $SiO_2$. Then, an alloy film 13 made of Cu and Mn (auxiliary film containing a predetermined metal element α) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage).

Figure 7B:
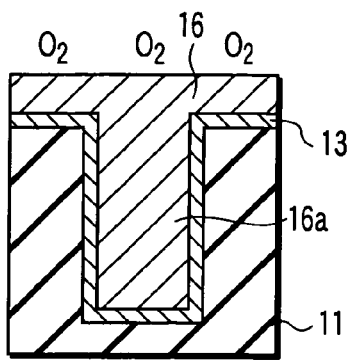

Then, as shown in FIG. 7B, a Cu main film 16 used as the material of an interconnection main layer is formed by electrolytic plating to fill the interconnection groove 12 with a Cu layer 16a. Then, a heat treatment is performed on the structure shown in FIG. 7B, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

Figure 7C:
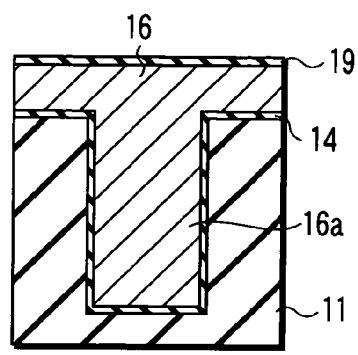

With this operation, Mn in the alloy film 13 is supplied with a force in directions to remove it from Cu, and thereby diffuses onto the surface of the interlevel insulating film 11 facing the alloy film 13, and also diffuses to the upper surface of the Cu main film 16. Mn thus supplied from the alloy film 13 reacts with O used as a component element of the interlevel insulating film 11, and with O present within the heat treatment atmosphere. As a consequence, as shown in FIG. 7C, a barrier film 14 containing MnO as the main component is formed by means of self alignment to cover the inner surface of the interlevel insulating film 11, and have a thickness of 5 nm or less, e.g., 2 nm. Further, an insulating film (reaction product film) 19 containing MnO as the main component is also formed to cover the upper surface of the Cu main film 16.

Thereafter, although not shown, the portion of the Cu main film 16 outside the interconnection groove 12 is polished and removed along with the insulating film 19 by, e.g., CMP, so that the interconnection main layer formed of the Cu layer 16a and having a low resistance is left in the interconnection groove 12. According to the seventh embodiment, since Mn also diffuses to the upper surface of the Cu main film 16, Mn is scarcely left in the Cu layer 16a, thereby preventing an increase in interconnection resistance.

As a modification of the seventh embodiment, the auxiliary film containing a predetermined metal element α may be a multi-layered structure formed of a Cu film 17 and a Mn film 18, as in the fourth embodiment. Also in this modification, a heat treatment for diffusing Mn is performed within an atmosphere containing oxygen, so that the same effects can be obtained.

Eighth Embodiment

Figure 8A:
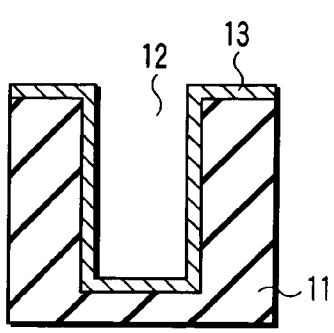
FIGS. 8A to 8C are sectional views showing the basic arrangement of sequential steps of a semiconductor device manufacturing method according to an eighth embodiment of the present invention.

As shown in FIG. 8A, an interconnection groove (opening) 12 is formed in an interlevel insulating film 11 made of $SiO_2$. Then, an alloy film 13 made of Cu and Mn (auxiliary film containing a predetermined metal element α) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage).

Figure 8B:
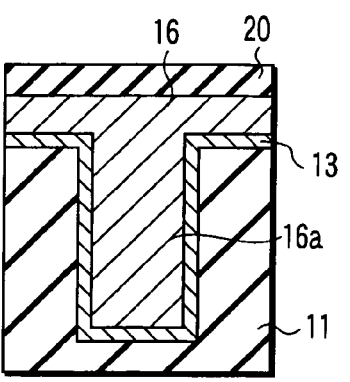

Then, as shown in FIG. 8B, a Cu main film 16 used as the material of an interconnection main layer is formed by electrolytic plating to fill the interconnection groove 12 with a Cu layer 16a. Then, an upper insulating film 20 containing oxygen, such as a $SiO_2$ film, or SiC, SiCN, or SiN film containing oxygen, is formed on the upper surface of the Cu main film 16. Then, a heat treatment is performed on the structure shown in FIG. 8B, at a temperature of 200 to 400° C. for 5 to 30 minutes, e.g., at 300° C. for 5 minutes.

Figure 8C:
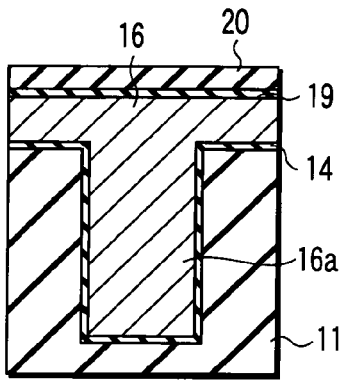

With this operation, Mn in the alloy film 13 is supplied with a force in directions to remove it from Cu, and thereby diffuses onto the surface of the interlevel insulating film 11 facing the alloy film 13, and also diffuses to the upper surface of the Cu main film 16. Mn thus supplied from the alloy film 13 reacts with O used as a component element of the interlevel insulating film 11, and with O used as a component element of the upper insulating film 20. As a consequence, as shown in FIG. 8C, a barrier film 14 containing MnO as the main component is formed by means of self alignment to cover the inner surface of the interlevel insulating film 11, and have a thickness of 5 nm or less, e.g., 2 nm. Further, an insulating film (reaction product film) 19 containing MnO as the main component is also formed to cover the upper surface of the Cu main film 16.

Thereafter, although not shown, the portion of the Cu main film 16 outside the interconnection groove 12 is polished and removed along with the insulating film 19 and upper insulating film 20 by, e.g., CMP, so that the interconnection main layer formed of the Cu layer 16a and having a low resistance is left in the interconnection groove 12.

As a modification of the eighth embodiment, the auxiliary film containing a predetermined metal element α may be a multi-layered structure formed of a Cu film 17 and a Mn film 18, as in the fourth embodiment. Also in this modification, a heat treatment for diffusing Mn is performed after forming the upper insulating film 20 containing oxygen, so that the same effects can be obtained.

Ninth Embodiment

Figure 9A:
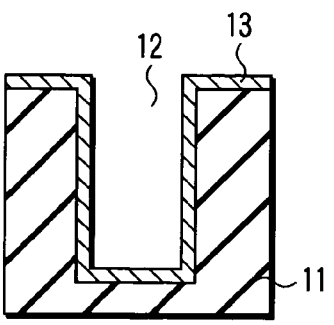
FIGS. 9A to 9C are sectional views showing the basic arrangement of sequential steps of a semiconductor device manufacturing method according to a ninth embodiment of the present invention.

As shown in FIG. 9A, an interconnection groove (opening) 12 is formed in an interlevel insulating film 11 made of $SiO_2$. Then, an alloy film 13 made of Cu and Mn (auxiliary film containing a predetermined metal element α) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage).

Figure 9B:
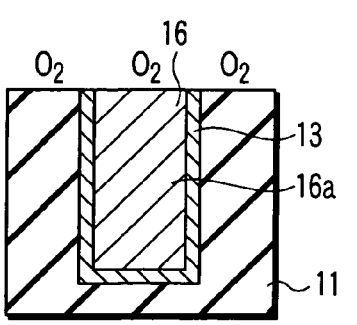

Then, as shown in FIG. 9B, a Cu main film 16 used as the material of an interconnection main layer is formed by electrolytic plating to fill the interconnection groove 12 with a Cu layer 16a. Then, the portion of the Cu main film 16 outside the interconnection groove 12 is polished and removed by, e.g., CMP, so that the interconnection main layer formed of the Cu layer 16a and having a low resistance is left in the interconnection groove 12. Then, a heat treatment is performed on the structure shown in FIG. 9B, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

Figure 9C:
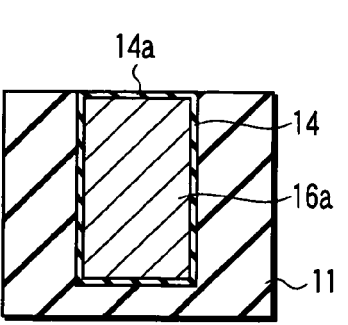

With this operation, Mn in the alloy film 13 is supplied with a force in directions to remove it from Cu, and thereby diffuses onto the surface of the interlevel insulating film 11 facing the alloy film 13, and also diffuses to the upper surface of the Cu layer 16a. Mn thus supplied from the alloy film 13 reacts with O used as a component element of the interlevel insulating film 11, and with O present within the heat treatment atmosphere. As a consequence, as shown in FIG. 9C, a barrier film 14 containing MnO as the main component is formed by means of self alignment to cover the inner surface of the interlevel insulating film 11, and have a thickness of 5 nm or less, e.g., 2 nm. Further, an upper barrier film 14a containing MnO as the main component is also formed to cover the upper surface of the Cu layer 16a. The upper barrier film can be used as a film for preventing Cu from diffusing from the Cu layer 16a into an interlevel insulating film further formed thereon.

As a modification of the ninth embodiment, the auxiliary film containing a predetermined metal element α may be a multi-layered structure formed of a Cu film 17 and a Mn film 18, as in the fourth embodiment. Also in this modification, a heat treatment for diffusing Mn is performed within an atmosphere containing oxygen after CMP, so that the same effects can be obtained.

Tenth Embodiment

Figure 10A:
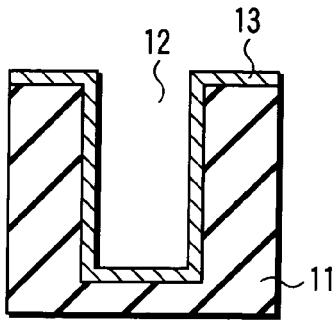
FIGS. 10A to 10C are sectional views showing the basic arrangement of sequential steps of a semiconductor device manufacturing method according to a tenth embodiment of the present invention.

As shown in FIG. 10A, an interconnection groove (opening) 12 is formed in an interlevel insulating film 11 made of $SiO_2$. Then, an alloy film 13 made of Cu and Mn (auxiliary film containing a predetermined metal element α) is formed on the interlevel insulating film 11 to cover the inner surface of the groove 12. The alloy film 13 is formed by, e.g., sputtering to have a thickness of 5 to 100 nm. The Mn content in the alloy film 13 is set to be 0.05 to 20 at % (atomic percentage).

Figure 10B:
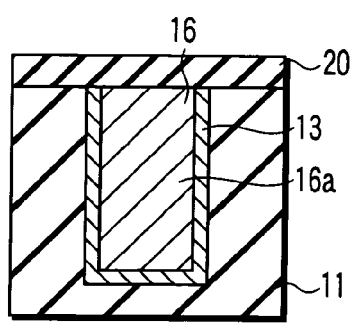

Then, as shown in FIG. 10B, a Cu main film 16 used as the material of an interconnection main layer is formed by electrolytic plating to fill the interconnection groove 12 with a Cu layer 16a. Then, the portion of the Cu main film 16 outside the interconnection groove 12 is polished and removed by, e.g., CMP, so that the interconnection main layer formed of the Cu layer 16a and having a low resistance is left in the interconnection groove 12. Then, an upper insulating film 20 containing oxygen, such as a $SiO_2$ film, or SiC, SiCN, or SiN film containing oxygen, is formed on the upper surface of the Cu layer 16a. Then, a heat treatment is performed on the structure shown in FIG. 10B, at a temperature of 200 to 400° C. for 5 to 30 minutes, e.g., at 300° C. for 5 minutes.

Figure 10C:
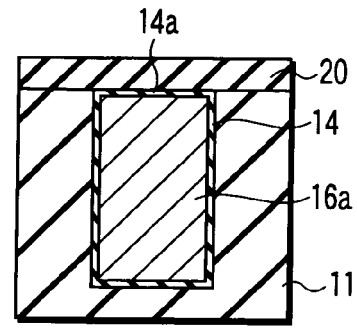

With this operation, Mn in the alloy film 13 is supplied with a force in directions to remove it from Cu, and thereby diffuses onto the surface of the interlevel insulating film 11 facing the alloy film 13, and also diffuses to the upper surface of the Cu layer 16a. Mn thus supplied from the alloy film 13 reacts with O used as a component element of the interlevel insulating film 11, and with O used as a component element of the upper insulating film 20. As a consequence, as shown in FIG. 10C, a barrier film 14 containing MnO as the main component is formed by means of self alignment to cover the inner surface of the interlevel insulating film 11, and have a thickness of 5 nm or less, e.g., 2 nm. Further, an upper barrier film 14a containing MnO as the main component is also formed to cover the upper surface of the Cu layer 16a.

As a modification of the tenth embodiment, the auxiliary film containing a predetermined metal element α may be a multi-layered structure formed of a Cu film 17 and a Mn film 18, as in the fourth embodiment. Also in this modification, a heat treatment for diffusing Mn is performed after performing CMP and then forming the upper insulating film 20 containing oxygen, so that the same effects can be obtained.

Eleventh Embodiment

Figure 11A:
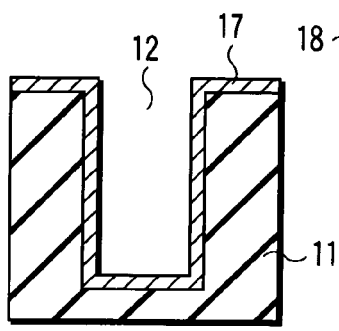
FIGS. 11A to 11C are sectional views showing the basic arrangement of sequential steps of a semiconductor device manufacturing method according to an eleventh embodiment of the present invention.

As shown in FIG. 11A, an interconnection groove (opening) 12 is formed in an interlevel insulating film 11 made of $SiO_2$. Then, a Cu film 17 is formed on the interlevel insulating film 11 to cover the inner surface of the groove 12. The Cu film 17 is formed by, e.g., sputtering to have a thickness of 5 to 100 nm. The Cu film 17 works as a seed layer for forming a Cu main film by electrolytic plating described later.

Figure 11B:
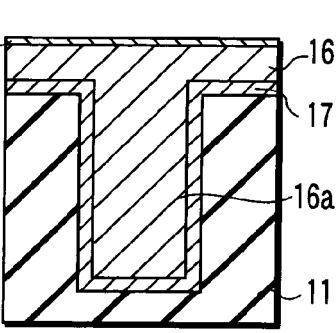

Then, as shown in FIG. 11B, a Cu main film 16 used as the material of an interconnection main layer is formed by electrolytic plating to fill the interconnection groove 12 with a Cu layer 16a. Then, a Mn film (auxiliary film containing a predetermined metal element α) 18 is formed on the Cu main film 16. The Mn film 18 is formed by, e.g., sputtering to have a thickness of 5 to 100 nm. Then, a heat treatment is performed on the structure shown in FIG. 11B, at a temperature of 200 to 400° C. for 5 to 30 minutes, e.g., at 300° C. for 5 minutes.

Figure 11C:
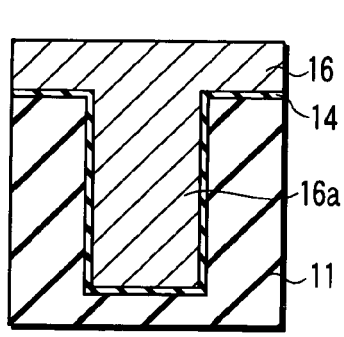

With this operation, Mn in the Mn film 18 diffuses onto the surface of the interlevel insulating film 11 facing the Cu film 17. Mn thus supplied from the Mn film 18 reacts with O used as a component element of the interlevel insulating film 11. As a consequence, as shown in FIG. 11C, a barrier film 14 containing, as the main component, a very stable compound or oxide made of MnO is formed by means of self alignment to cover the inner surface of the interlevel insulating film 11, and have a thickness of 5 nm or less, e.g., 2 nm. At this time, the Cu film 17 is essentially integrated with the interconnection main layer formed of the Cu layer 16a.

Thereafter, although not shown, the portion of the Cu main film 16 outside the interconnection groove 12 is polished and removed by, e.g., CMP, so that the interconnection main layer formed of the Cu layer 16a and having a low resistance is left in the interconnection groove 12.

Twelfth Embodiment

Figure 12A:
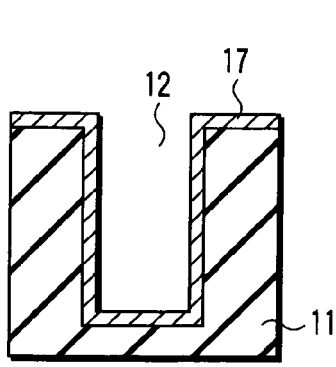
FIGS. 12A to 12C are sectional views showing the basic arrangement of sequential steps of a semiconductor device manufacturing method according to a twelfth embodiment of the present invention.

As shown in FIG. 12A, an interconnection groove (opening) 12 is formed in an interlevel insulating film 11 made of $SiO_2$. Then, a Cu film 17 is formed on the interlevel insulating film 11 to cover the inner surface of the groove 12. The Cu film 17 is formed by, e.g., sputtering to have a thickness of 5 to 100 nm.

Figure 12B:
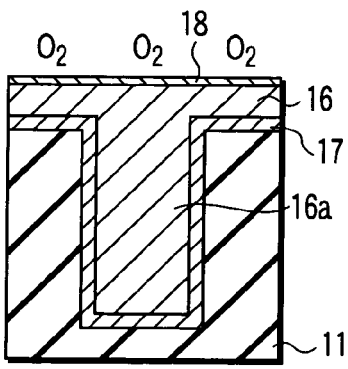

Then, as shown in FIG. 12B, a Cu main film 16 used as the material of an interconnection main layer is formed by electrolytic plating to fill the interconnection groove 12 with a Cu layer 16a. Then, a Mn film (auxiliary film containing a predetermined metal element α) 18 is formed on the Cu main film 16. The Mn film 18 is formed by, e.g., sputtering to have a thickness of 5 to 100 nm. Then, a heat treatment is performed on the structure shown in FIG. 12B, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

Figure 12C:
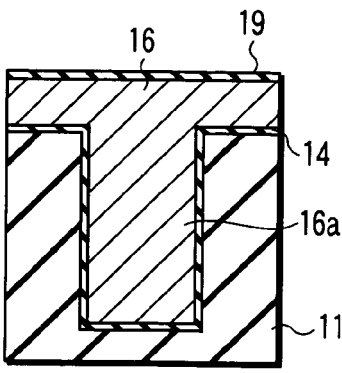

With this operation, Mn in the Mn film 18 diffuses onto the surface of the interlevel insulating film 11 facing the Cu film 17, and also stays at the upper surface of the Cu main film 16 due to an influence of oxygen contained in the heat treatment atmosphere. Mn thus supplied from the Mn film 18 reacts with O used as a component element of the interlevel insulating film 11, and with O present within the heat treatment atmosphere. As a consequence, as shown in FIG. 12C, a barrier film 14 containing MnO as the main component is formed by means of self alignment to cover the inner surface of the interlevel insulating film 11, and have a thickness of 5 nm or less, e.g., 2 nm. Further, an insulating film (reaction product film) 19 containing MnO as the main component is also formed to cover the upper surface of the Cu main film 16.

Thereafter, although not shown, the portion of the Cu main film 16 outside the interconnection groove 12 is polished and removed along with the insulating film 19 by, e.g., CMP, so that the interconnection main layer formed of the Cu layer 16a and having a low resistance is left in the interconnection groove 12.

Thirteenth Embodiment

As shown in FIG. 13A, an interconnection groove (opening) 12 is formed in an interlevel insulating film 11 made of $SiO_2$. Then, a Cu film 17 is formed on the interlevel insulating film 11 to cover the inner surface of the groove 12. The Cu film 17 is formed by, e.g., sputtering to have a thickness of 5 to 100 nm.

Then, as shown in FIG. 13B, a Cu main film 16 used as the material of an interconnection main layer is formed by electrolytic plating to fill the interconnection groove 12 with a Cu layer 16a. Then, a Mn film (auxiliary film containing a predetermined metal element α) 18 is formed on the Cu main film 16. The Mn film 18 is formed by, e.g., sputtering to have a thickness of 5 to 100 nm. Then, an upper insulating film 20 containing oxygen, such as a $SiO_2$ film, or SiC, SiCN, or SiN film containing oxygen, is formed on the Mn film 18. Then, a heat treatment is performed on the structure shown in FIG. 13B, at a temperature of 200 to 400° C. for 5 to 30 minutes, e.g., at 300° C. for 5 minutes.

With this operation, Mn in the Mn film 18 diffuses onto the surface of the interlevel insulating film 11 facing the alloy film 13, and also stays at the upper surface of the Cu main film 16 due to an influence of oxygen contained in the upper insulating film 20 as a component element. Mn thus supplied from the Mn film 18 reacts with O used as a component element of the interlevel insulating film 11, and with O used as a component element of the upper insulating film 20. As a consequence, as shown in FIG. 13C, a barrier film 14 containing MnO as the main component is formed by means of self alignment to cover the inner surface of the interlevel insulating film 11, and have a thickness of 5 nm or less, e.g., 2 nm. Further, an insulating film (reaction product film) 19 containing MnO as the main component is also formed to cover the upper surface of the Cu main film 16.

Thereafter, although not shown, the portion of the Cu main film 16 outside the interconnection groove 12 is polished and removed along with the insulating film 19 and upper insulating film 20 by, e.g., CMP, so that the interconnection main layer formed of the Cu layer 16a and having a low resistance is left in the interconnection groove 12.

(Matters Common to the First to Thirteenth Embodiments)

FIG. 14 is a view showing characteristics of various Cu alloys, in terms of change in resistivity relative to heat treatment temperature. In FIG. 14, the horizontal axis denotes heat treatment temperature T(° C.), and the vertical axis denotes alloy resistivity R ($\mu\Omega$ cm). Where an alloy is formed of Cu with Ni, Mg, or Al, the resistivity greatly increases when the heat treatment temperature exceeds 350° C. By contrast, where an alloy is formed of Cu with Mn, the resistivity decreases to be equal to that of pure copper as the heat treatment temperature is higher. This means that Mn used as the alloy element does not stay as solid solution in the Cu film, but moves to the interface, thereby reducing the resistivity to be equal to that of pure copper. Accordingly, Mn used as the alloy element can realize an interconnection with a lower resistance, as compared to conventional interconnections.

FIG. 15 is a view showing a TEM micrographic image of a cross section of a semiconductor device manufactured by the first embodiment. As shown in FIG. 15, a barrier film 14 made of MnO (it can be expressed more properly by $Mn_xSi_yO_z$ (x:y:z=1:1:3 to 1:3:5)) and having a thickness of about 3 nm is uniformly formed between a Cu layer 16a and an interlevel insulating film 11. In other words, a stable compound is formed at the interface between the Cu layer 16a and interlevel insulating film 11.

As described above, according to the first embodiment, an alloy film of Cu with Mn is employed and formed as an auxiliary film containing Mn or a predetermined metal element $\alpha$, and is then subjected to a heat treatment. With this operation, a MnO barrier film is formed by means of self alignment at the interface between the alloy film and the interlevel insulating film or $SiO_2$ film. The resistivity of the portion where the alloy film was formed becomes as low as pure copper, after the heat treatment. As a consequence, a Cu interconnection is formed by a barrier self-formation process without increasing the electric resistance of the interconnection, thereby improving the reliability of the interconnection structure and reducing the interconnection resistance. The same effects can be also attained in any one of the second to thirteenth embodiments described above.

The methods described above according to the first to thirteenth embodiments are preferably applicable to a damascene interconnection structure, as shown in the following embodiments.

Fourteenth Embodiment

FIGS. 16A to 16F are sectional views showing sequential steps of a semiconductor device manufacturing method according to a fourteenth embodiment of the present invention. In this embodiment, the first embodiment is applied to a dual damascene interconnection structure.

Figure 16A:
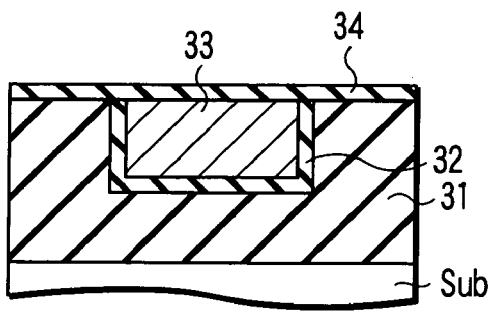
FIGS. 16A to 16F are sectional views showing sequential steps of a semiconductor device manufacturing method according to a fourteenth embodiment of the present invention.

As shown in FIG. 16A, an interlevel insulating film 31 formed of, e.g., a $SiO_2$ film is disposed with an interconnection groove formed in the surface thereof, on a semiconductor substrate Sub. The interconnection groove is filled with a Cu layer (lower interconnection layer (i.e., conductive layer)) 33 with a barrier film 32 interposed therebetween. The barrier film 32 and Cu layer 33 may be prepared by a method according to any one of the first to thirteenth embodiments.

Figure 16B:
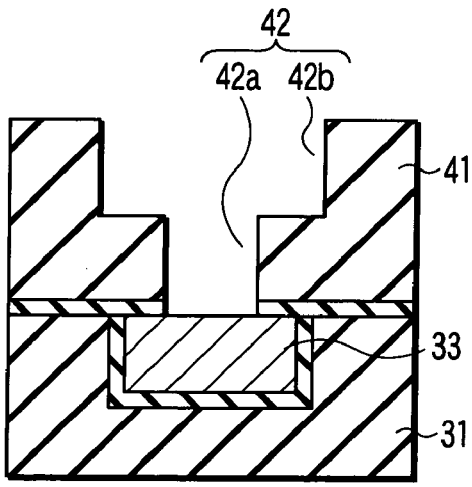

On the structure described above, as shown in FIG. 16A, a diffusion prevention film (lower insulating film) 34, such as SiN or SiCN, is formed. Then, as shown in FIG. 16B, an interlevel insulating film 41 made of $SiO_2$ is deposited to have a thickness of 150 to 600 nm. Then, an opening 42 is formed in the interlevel insulating film 41 to include an interconnection hole 42a for connection to the Cu layer 33 and an interconnection groove 42b.

Figure 16C:
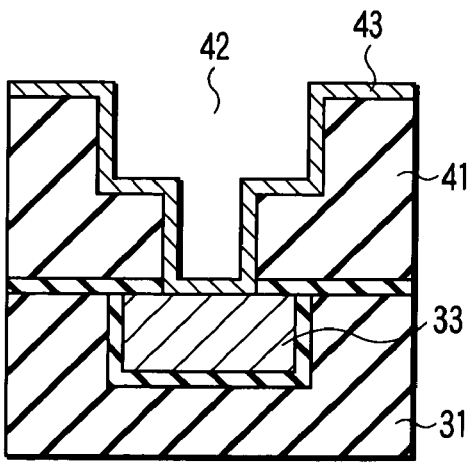
Figure 16D:
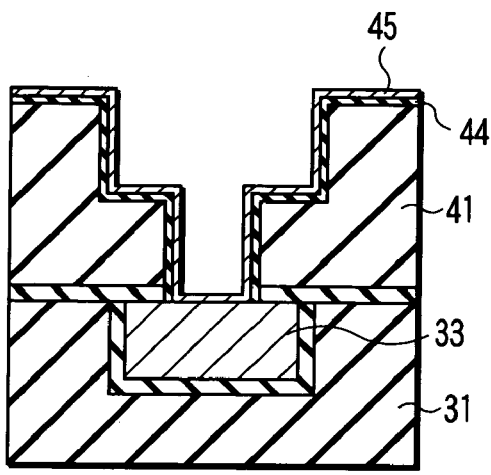

Then, as shown in FIG. 16C, an alloy film 43 made of Cu and Mn (auxiliary film containing a predetermined metal element $\alpha$) is formed by, e.g., CVD to cover the inner surface of the opening 42 and have a thickness of 5 to 100 nm. Then, as shown in FIG. 16D, a heat treatment is performed at a temperature of 200 to 400° C. for 5 to 30 minutes, e.g., at 300° C. for 5 minutes.

With this operation, a barrier film 44 containing MnO as the main component is formed to cover the inner surface of the opening 42 of the interlevel insulating film 41. At this time, at the bottom of the interconnection hole 42a, since no interlevel insulating film 41 is present, no barrier film 44 is formed, but only a Cu film 45 is formed. Accordingly, a Cu upper interconnection layer formed later will come into essentially direct contact with the Cu layer (lower interconnection layer) 33 with no barrier film 44 interposed therebetween.

Figure 16E:
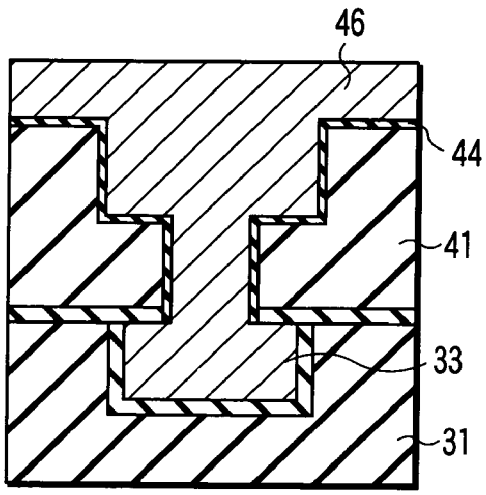
Figure 16F:
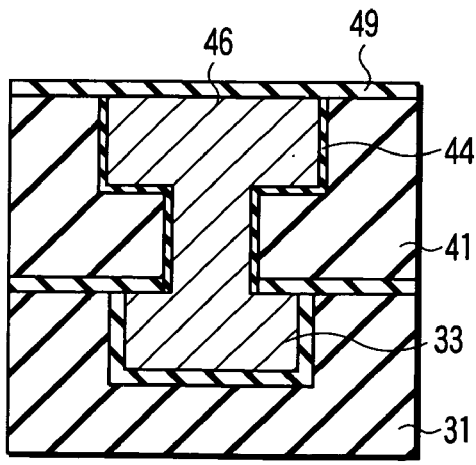

Then, as shown in FIG. 16E, a Cu main film 46 having a thickness of 0.8 to 1 $\mu$m is deposited all over by electrolytic plating to fill the opening 42 with the Cu main film (upper interconnection layer) 46. Then, as shown in FIG. 16F, the unnecessary portion of the Cu main film 46 is removed by CMP to planarize the structure surface. Then, a diffusion prevention film 49, such as a SiC, SiCN, or SiN film, is formed all over the structure surface.

The alloy film 43 may be formed by any one of PVD, CVD, and electroless plating methods. In the case of the CVD method, a source gas containing Mn is employed. In the case of the electroless plating method, a plating solution containing Mn is employed. The Cu—Mn alloy film 43 preferably contains 0.05 to 20% Mn by atomic percentage. The heat treatment for diffusing Mn to the surface of the interlevel insulating film 41 is preferably performed at a temperature of 50 to 400° C. for 60 minutes or less.

According to this semiconductor device having a dual damascene structure thus manufactured, the barrier film 44 containing MnO as the main component is formed by means of self alignment at the interface between the Cu main film 46 used as an interconnection main layer and the $SiO_2$ interlevel insulating film 41. The Cu main film 46 used as an upper interconnection layer is in essentially direct contact with the Cu lower interconnection layer 33 with no barrier film interposed therebetween, and the contact resistance between the interconnection layers is thereby reduced. As a consequence, a Cu interconnection is formed by barrier self-formation process without increasing the electric resistance of the interconnection, thereby improving the reliability of the interconnection structure and reducing the interconnection resistance.

Figure 17:
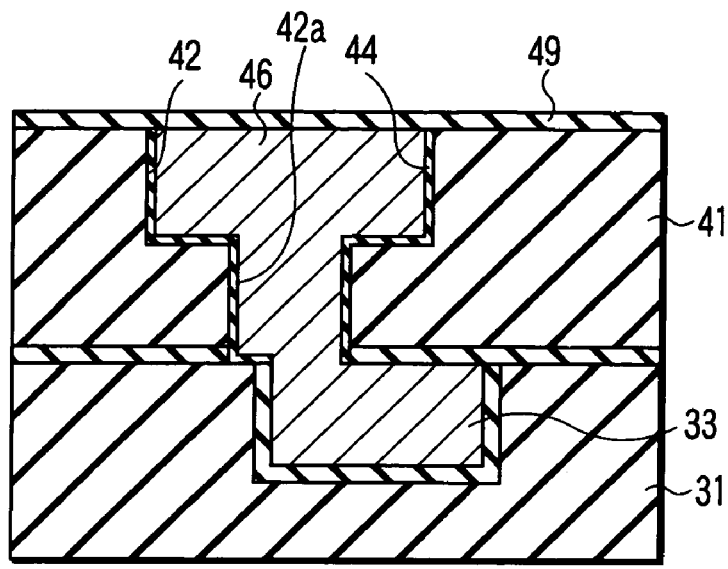
FIG. 17 is a sectional view showing a semiconductor device according to a modification of the fourteenth embodiment.

FIG. 17 is a sectional view showing a semiconductor device according to a modification of the fourteenth embodiment. As shown in FIG. 17, where a positional deviation is present between a lower interconnection layer 33 and an upper interconnection layer 46, an interconnection hole 42a may partly deviate from the lower interconnection layer 33. In this case, a barrier film 44 is formed on an interlevel insulating film 31 even to the bottom of the interconnection hole 42a, and thus a part of the barrier film 44 is present at the bottom of the opening 42. However, no barrier film 44 is formed between the upper and lower interconnection layers 46 and 33. Accordingly, unless the positional deviation is excessively large, the upper and lower interconnection layers 46 and 33 have sufficient contact therebetween.

Although the first embodiment is utilized in this embodiment, the same effects can be attained where any one of the second to thirteenth embodiments is utilized.

Fifteenth Embodiment

Figure 18:
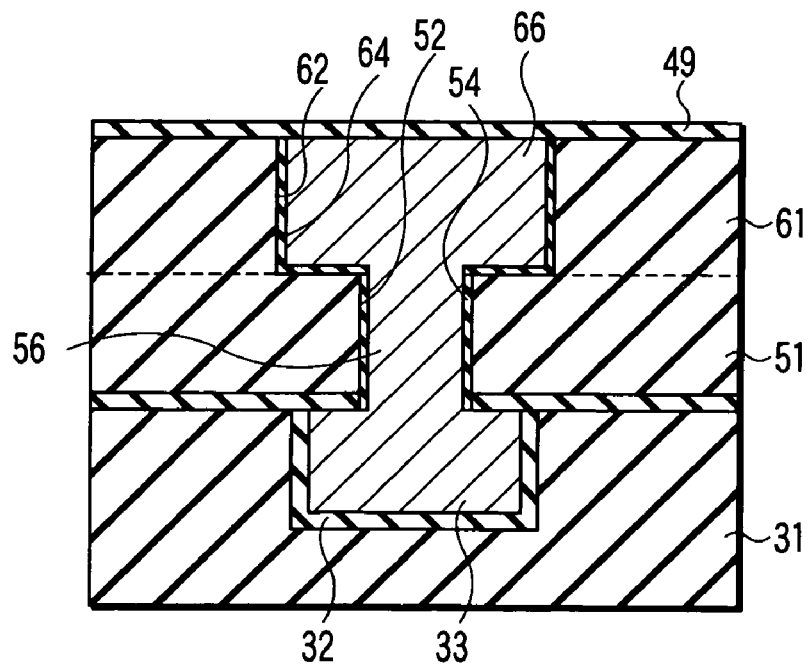
FIG. 18 is a sectional view showing a semiconductor device according to a fifteenth embodiment of the present invention.

FIG. 18 is a sectional view showing a semiconductor device according to a fifteenth embodiment of the present invention. In this embodiment, the first embodiment is applied to a single damascene interconnection structure. This device may be manufactured by a method almost the same as that of the fourteenth embodiment, except for the following points.

Specifically, on the structure shown in FIG. 16A, an interlevel insulating film 51 made of $SiO_2$ and having a thickness of 150 to 300 nm is deposited, and an interconnection hole 52 for connection to a lower interconnection layer 33 is formed therein. Then, a Cu—Mn alloy film is formed by, e.g., CVD to cover the inner surface of the interconnection hole 52 and have a thickness of 5 to 100 nm. Then, a heat treatment is performed to form a MnO barrier film 54 on the inner surface of the hole of the interlevel insulating film 51. Then, a Cu film 56 is formed to fill the interconnection hole 52, and the unnecessary portion of the Cu film 56 is removed by CMP.

Then, an interlevel insulating film 61, an interconnection groove 62, a MnO barrier film 64, and a Cu film 66 are formed by the same processes used for the parts 51 to 56. Then, the unnecessary portion of the Cu film 66 is removed by CMP, and a diffusion prevention film 49 is formed.

Also in this arrangement, the MnO barrier films 54 and 64 are formed between the Cu films 56 and 66 filling the interconnection hole 52 and interconnection groove 62, and the interlevel insulating films 51 and 61. The Cu film 56 used as a connection plug is in direct contact with the Cu lower interconnection layer 33, and the Cu film 66 used as an upper interconnection layer is in direct contact with the Cu film 56. As a consequence, the fifteenth embodiment provides the same effects as the fourteenth embodiment.

Sixteenth Embodiment

Figure 19A:
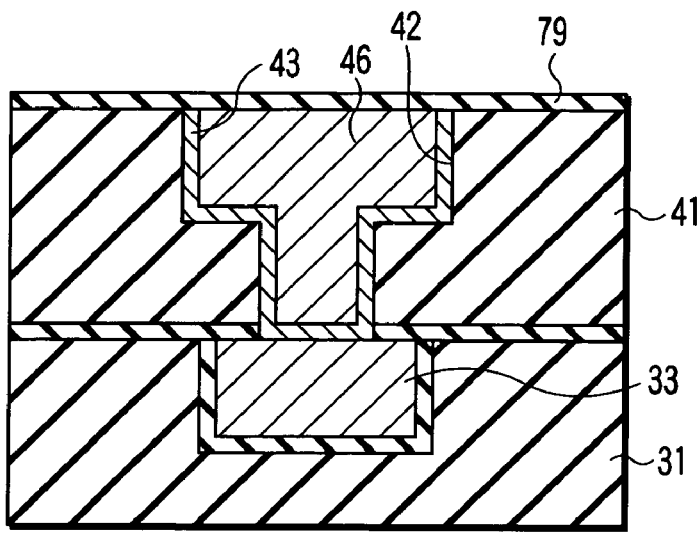
FIGS. 19A to 19C are sectional views showing sequential steps of a semiconductor device manufacturing method according to a sixteenth embodiment of the present invention.
Figure 19B:
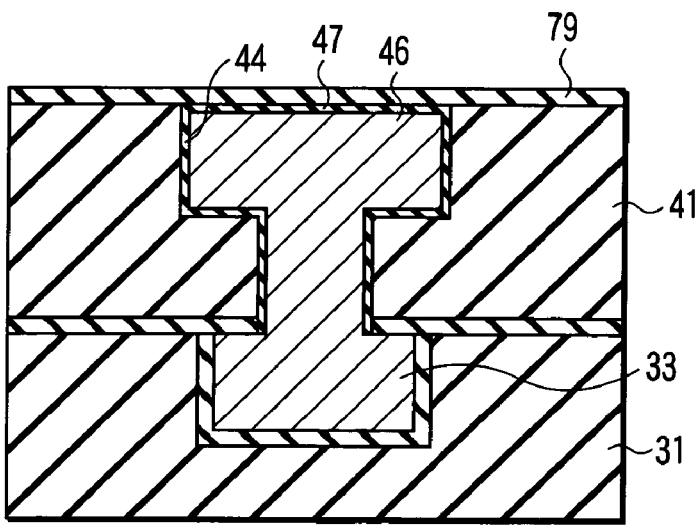
Figure 19C:
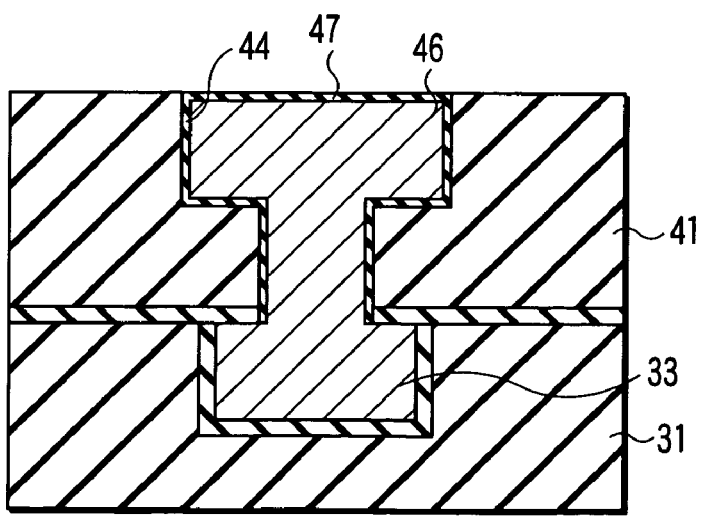

FIGS. 19A to 19C are sectional views showing sequential steps of a semiconductor device manufacturing method according to a sixteenth embodiment of the present invention. In this embodiment, the tenth embodiment is applied to a dual damascene interconnection structure.

On the structure shown in FIG. 16C with a Cu—Mn alloy layer 43 formed thereon, a Cu main film 46 is formed to fill the opening 42, as shown in FIG. 19A. Then, the unnecessary portion of the Cu main film 46 is removed by CMP to planarize the surface. Then, an upper insulating film 79 containing oxygen, such as a $SiO_2$ film, is formed on the upper surface of the Cu main film 46. Then, a heat treatment is performed on the structure shown in FIG. 19A, at a temperature of 200 to 400° C. for 5 to 30 minutes, e.g., at 300° C. for 5 minutes.

With this operation, a barrier film 44 containing MnO as the main component is formed to cover the inner surface of the opening 42 of the interlevel insulating film 41. At this time, at the bottom of the interconnection hole 42a, since no interlevel insulating film 41 is present, no barrier film 44 is formed. Accordingly, the upper and lower interconnection layers 46 and 33 are in essentially direct contact with each other with no barrier film 44 interposed therebetween.

Further, since the oxide film 79 is present on the upper surface of the Cu main film 46, Mn diffuses there, thereby forming an upper barrier film (reaction product film) 47 containing MnO as the main component.

Then, as shown in FIG. 19C, the upper insulating film 79 is removed. As a consequence, only the upper barrier film 47 functioning as a barrier film is left on the Cu main film 46 (no barrier film 47 is present above the interlevel insulating film 41).

In addition to the same effects as the fourteenth embodiment, this embodiment can provide the following effects because of the upper barrier film 47 present only on the Cu main film 46. Specifically, in general, a Cu embedded interconnection structure requires a diffusion prevention film with a high dielectric constant, such as a SiC, SiCN, or SiN film, to be disposed on the Cu main film 46. Where such a diffusion prevention film is disposed all over the structure surface, the capacitance between adjacent interconnections becomes higher due to the presence of the diffusion prevention film. By contrast, in this embodiment, the barrier film 47 disposed on the Cu main film 46 functions as a protection film, and thus requires no additional diffusion prevention film to be formed. Accordingly, there is no high dielectric constant film, such as a nitride film, present between adjacent interconnections, thereby reducing the capacitance between the adjacent interconnections.

Seventeenth Embodiment

FIGS. 20A to 20E are sectional views showing sequential steps of a semiconductor device manufacturing method according to a seventeenth embodiment of the present invention. In this embodiment, the seventh embodiment is applied to a dual damascene interconnection structure.

Figure 20A:
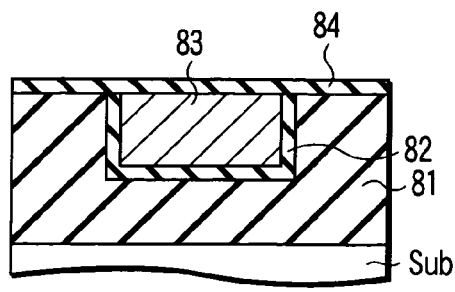
FIGS. 20A to 20E are sectional views showing sequential steps of a semiconductor device manufacturing method according to a seventeenth embodiment of the present invention.

As shown in FIG. 20A, an interlevel insulating film 81 formed of, e.g., a $SiO_2$ film is disposed with an interconnection groove formed in the surface thereof, on a semiconductor substrate Sub. The interconnection groove is filled with a Cu layer (lower interconnection layer (i.e., conductive layer)) 83 with a barrier film 82 interposed therebetween. The barrier film 82 and Cu layer 83 may be prepared by a method according to any one of the first to thirteenth embodiments.

Figure 20B:
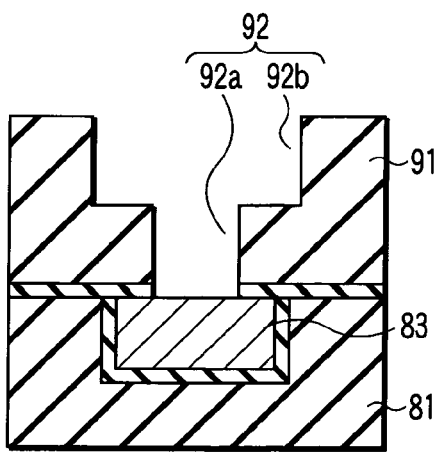

On the structure described above, as shown in FIG. 20A, a diffusion prevention film (lower insulating film) 84 is formed. The diffusion prevention film 84 is made of, e.g., SiN or SiCN containing oxygen at a concentration of 33% or less by atomic percentage, and having an atomic density higher than the interlevel insulating film 81. Then, as shown in FIG. 20B, an interlevel insulating film 91 made of $SiO_2$ is deposited to have a thickness of 150 to 600 nm. Then, an opening 92 is formed in the interlevel insulating film 91 to include an interconnection hole 92a for connection to the Cu layer (lower interconnection layer) 83 and an interconnection groove 92b. At this time, the interconnection hole 92a is formed to pass through the diffusion prevention film 84 and reach the lower interconnection layer 83.

Figure 20D:
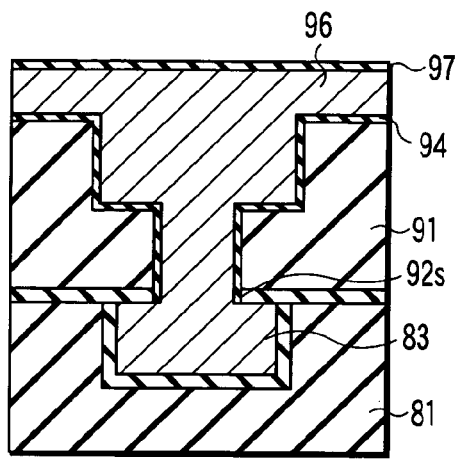
Figure 20C:
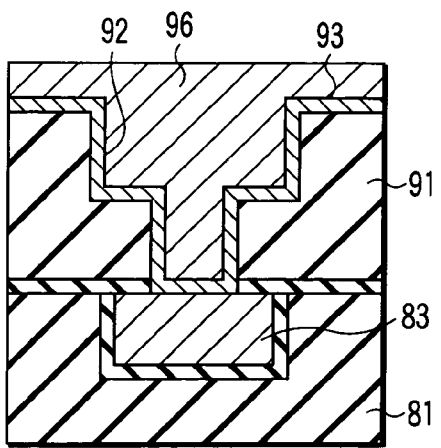

Then, as shown in FIG. 20C, an alloy film 93 made of Cu and Mn (auxiliary film containing a predetermined metal element α) is formed by, e.g., CVD to cover the inner surface of the opening 92 and have a thickness of 5 to 100 nm. Then, a Cu main film 96 having a thickness of 0.8 to 1 μm is deposited all over by electrolytic plating to fill the opening 92 with the Cu main film (upper interconnection layer) 96. Then, a heat treatment is performed on the structure shown in FIG. 20C, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

With this operation, as shown in FIG. 20D, a barrier film 94 containing MnO as the main component is formed to cover the inner surface of the opening 92 of the interlevel insulating film 91. Further, since the upper surface of the Cu main film 96 is exposed to the atmosphere containing oxygen, Mn diffuses there, thereby forming an insulating film (reaction product film) 97 containing MnO as the main component.

Figure 20E:
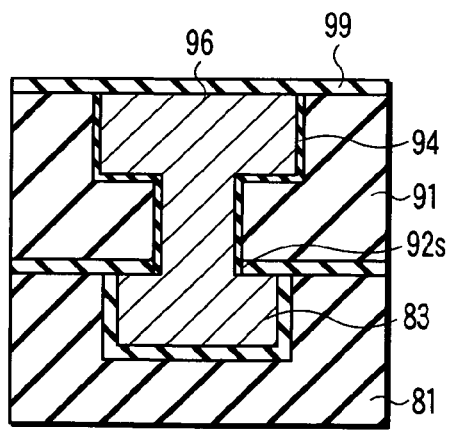

Then, as shown in FIG. 20E, the unnecessary portion of the Cu main film 96 is removed along with the insulating film 97 by CMP to planarize the structure surface. Then, a diffusion prevention film 99, such as a SiN or SiCN film, is formed all over the structure surface.

According to this embodiment, the diffusion prevention film 84 interposed between the lower interconnection layer 83 and interlevel insulating film 91 contains oxygen. As a consequence, the barrier film 94 containing MnO as the main component is reliably formed by means of self alignment also on the inner surface of the portion 92s of the interconnection hole 92a passing through the diffusion prevention film 84. This can prevent defects from being generated in the barrier film 94 at this portion 92s, which would allow Cu to diffuse through from the interconnection layer.

FIG. 21 is a graph showing the oxygen concentration distribution in the diffusion prevention film 84 according to a modification of the seventeenth embodiment. In FIG. 21, the horizontal axis denotes the position Th (nm) of the diffusion prevention film 84 in the film thickness direction, relative to the surface of the lower interconnection layer 83 used as the reference point, and the vertical axis denotes the oxygen concentration Con-O (atomic %) in the diffusion prevention film 84.

Where the oxygen concentration in the diffusion prevention film 84 is high near the lower interconnection layer 83, Cu in the lower interconnection layer 83 may be oxidized, thereby deteriorating device properties. For this reason, in this modification, the oxygen concentration in the diffusion prevention film 84 is set lower on the lower interconnection layer 83 side than on the interlevel insulating film 91 side.

As a method of forming such a diffusion prevention film 84, a method of depositing the film 84 by CVD may be arranged such that the oxygen concentration in the process atmosphere is set lower at first, and is then gradually increased. Alternatively, the diffusion prevention film 84 may have a multi-layered structure formed of a lower layer of several nm and an upper layer both deposited by CVD, in which only the lower layer has a lower oxygen concentration, while the upper layer has a sufficiently high oxygen concentration.

Eighteenth Embodiment

FIGS. 22A to 22E are sectional views showing sequential steps of a semiconductor device manufacturing method according to an eighteenth embodiment of the present invention. This embodiment is a modification of the seventeenth embodiment.

Figure 22A:
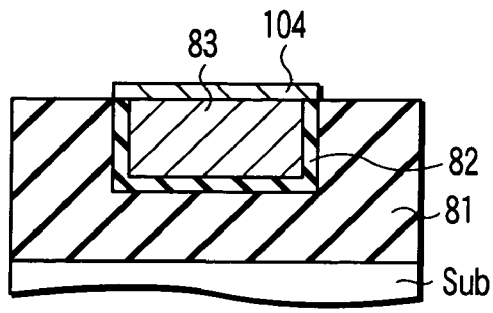
FIGS. 22A to 22E are sectional views showing sequential steps of a semiconductor device manufacturing method according to an eighteenth embodiment of the present invention.

As shown in FIG. 22A, an interlevel insulating film 81 is disposed with an interconnection groove formed in the surface thereof, on a semiconductor substrate Sub. The interconnection groove is filled with a Cu layer (lower interconnection layer) 83 with a barrier film 82 interposed therebetween. The barrier film 82 and Cu layer 83 may be prepared by a method according to any one of the first to thirteenth embodiments.

Figure 22B:
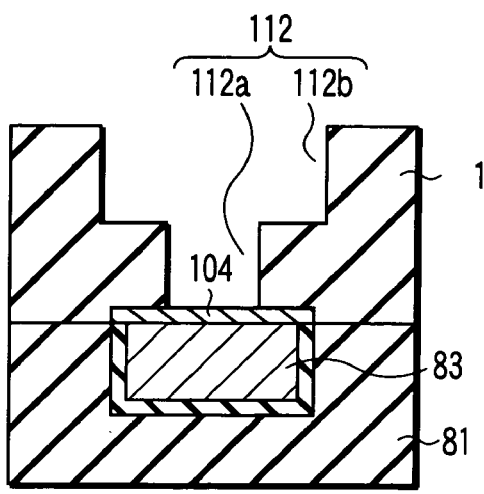

On the structure described above, as shown in FIG. 22A, a refractory metal layer 104 is formed on the barrier film 82 and Cu layer 83. The refractory metal layer 104 is made of, e.g., CoW, CoWB, CoWP, or CuSi to prevent the lower interconnection layer 83 from being oxidized or causing Cu diffusion. Then, as shown in FIG. 22B, an interlevel insulating film 111 made of $SiO_2$ is deposited to have a thickness of 150 to 600 nm. Then, an opening 112 is formed in the interlevel insulating film 111 to include an interconnection hole 112a for connection to the Cu layer 83 and an interconnection groove 112b. At this time, the interconnection hole 112a is formed to terminate on the upper surface of the refractory metal layer 104.

Figure 22D:
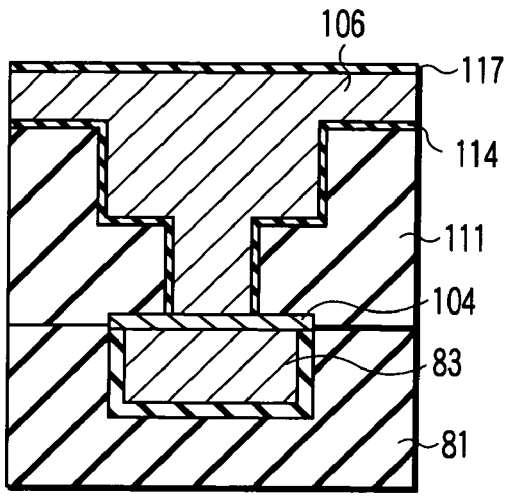
Figure 22C:
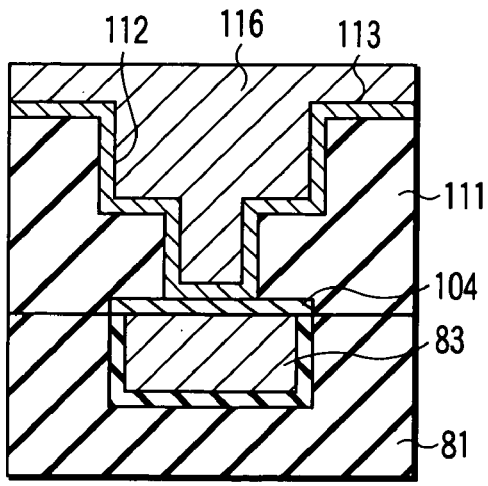

Then, as shown in FIG. 22C, an alloy film 113 made of Cu and Mn (auxiliary film containing a predetermined metal element α) is formed by, e.g., CVD to cover the inner surface of the opening 112 and have a thickness of 5 to 100 nm. Then, a Cu main film 116 having a thickness of 0.8 to 1 μm is deposited all over by electrolytic plating to fill the opening 112 with the Cu main film (upper interconnection layer) 116. Then, a heat treatment is performed on the structure shown in FIG. 22C, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

With this operation, as shown in FIG. 22D, a barrier film 114 containing MnO as the main component is formed to cover the inner surface of the opening 112 of the interlevel insulating film 111. Further, since the upper surface of the Cu main film 116 is exposed to the atmosphere containing oxygen, Mn diffuses there, thereby forming an insulating film (reaction product film) 117 containing MnO as the main component.

Figure 22E:
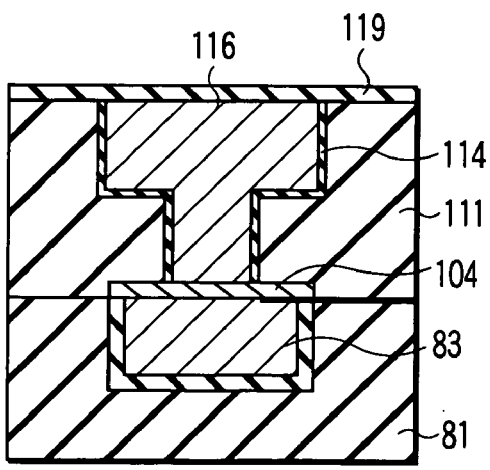

Then, as shown in FIG. 22E, the unnecessary portion of the Cu main film 116 is removed along with the insulating film 117 by CMP to planarize the structure surface. Then, a diffusion prevention film 119, such as a SiN or SiCN film, is formed all over the structure surface.

According to this embodiment, since the upper surface of the lower interconnection layer 83 is covered with the refractory metal layer 104, the lower interconnection layer 83 is prevented from being oxidized or causing Cu diffusion.

FIG. 23 is a sectional view showing a semiconductor device according to a modification of the eighteenth embodiment. In this modification, an interconnection hole 112a formed in the interlevel insulating film 111 further passes through the refractory metal layer 104 and reaches the lower interconnection layer 83. In this case, the upper and lower interconnection layers 116 and 83 are in direct contact with each other, thereby reducing the interconnection resistance.

Nineteenth Embodiment

FIGS. 24A to 24F are sectional views showing sequential steps of a semiconductor device manufacturing method according to a nineteenth embodiment of the present invention. This embodiment is another modification of the seventeenth embodiment.

Figure 24A:
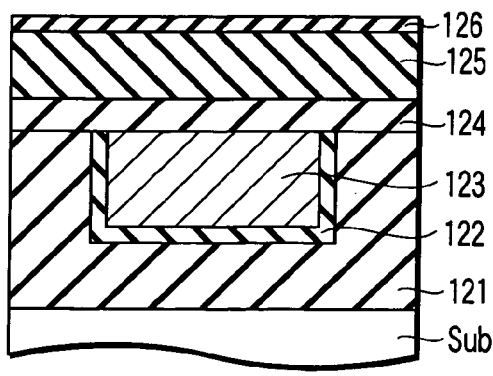

As shown in FIG. 24A, an interlevel insulating film 121 is disposed with an interconnection groove formed in the surface thereof, on a semiconductor substrate Sub. The interlevel insulating film 121 is formed of a low dielectric constant film, such as a porous $SiO_2$, SiC, SiOC, SiOCH, or SiCOF film. The interconnection groove is filled with a Cu layer (lower interconnection layer (i.e., conductive layer)) 123 with a barrier film 122 interposed therebetween. The barrier film 122 and Cu layer 123 may be prepared by a method according to any one of the first to thirteenth embodiments.

On the structure described above, as shown in FIG. 24A, a diffusion prevention film (lower insulating film) 124, an interlevel insulating film 125, and an etching stop film 126 are formed in this order. The diffusion prevention film 124 is made of, e.g., SiN or SiCN having an atomic density higher than the interlevel insulating film 121, but containing essentially no oxygen unlike the diffusion prevention film 84 describe above. The interlevel insulating film 125 consists of a porous low dielectric constant film, essentially the same as that used for the interlevel insulating film 121. The etching stop film 126 is made of an insulating material, such as SiN, SiCN, or polymer material, e.g., PAE (polyallylene), which contains oxygen at a concentration of 33% or less by atomic percentage, and has an atomic density higher than the interlevel insulating films 121 and 125.

Figure 24B:
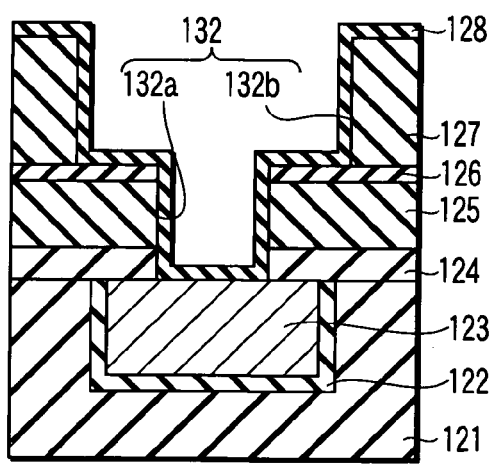

Then, as shown in FIG. 24B, an interlevel insulating film 127 consisting of a porous low dielectric constant film, the same as that used for the interlevel insulating film 121, is formed on the etching stop film 126. Then, an opening 132 is formed in the interlevel insulating film 127 and diffusion prevention film 124 to include an interconnection hole 132a for connection to the Cu layer (lower interconnection layer) 123 and an interconnection groove 132b. At this time, the interconnection groove 132b is formed to terminate on the etching stop film 126, and the interconnection hole 132a is formed to extend therefrom through the diffusion prevention film 124 onto the lower interconnection layer 123. Then, a coating film 128, which is made of an insulating material containing oxygen and hiving a higher atomic density, i.e., the same material as the etching stop film 126, is formed to cover the inner surface of the opening 132.

Figure 24C:
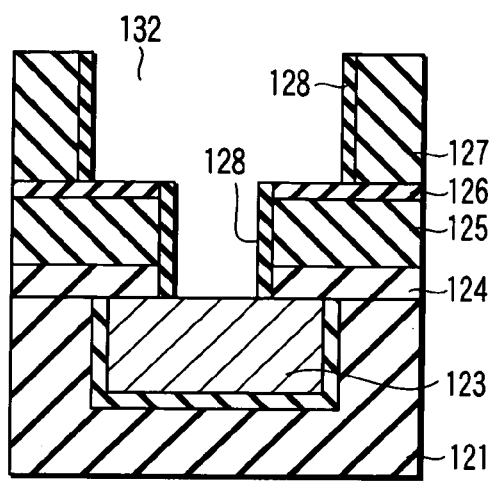

Then, as shown in FIG. 24C, anisotropic etching is performed vertically from above by RIE, to remove the portion of the coating film 128 at the bottom of the interconnection hole 132a, so that the lower interconnection layer 123 is exposed. At this time, the portion of the coating film 128 on the etching stop film 126 is also removed, and the etching stop film 126 is thereby exposed.

Figure 24D:
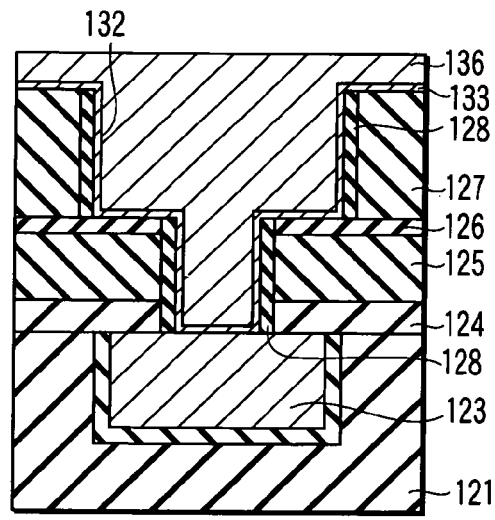

Then, as shown in FIG. 24D, an alloy film 133 made of Cu and Mn (auxiliary film containing a predetermined metal element $\alpha$) is formed by, e.g., CVD to cover the inner surface of the opening 132 (surfaces of the etching stop film 126 and coating film 128) and have a thickness of 5 to 100 nm. Then, a Cu main film 136 having a thickness of 0.8 to 1 μm is deposited all over by electrolytic plating to fill the opening 132 with the Cu main film (upper interconnection layer) 136. Then, a heat treatment is performed on the structure shown in FIG. 24D, at a temperature of 200 to 400° C. for 5 to 30 minutes, e.g., at 300° C. for 5 minutes. At this time, the heat treatment is performed within an atmosphere containing oxygen, such as an inactive gas atmosphere of, e.g., Ar, containing $O_2$ at a volume ratio of 1 ppm to 10%.

With this operation, as shown in FIG. 24E, a barrier film 134 containing MnO as the main component is formed to cover the inner surface of the opening 132 of the interlevel insulating films 125 and 127. Further, since the upper surface of the Cu main film 136 is exposed to the atmosphere containing oxygen, Mn diffuses there, thereby forming an insulating film (reaction product film) 137 containing MnO as the main component.

Then, as shown in FIG. 24F, the unnecessary portion of the Cu main film 136 is removed along with the insulating film 137 by CMP to planarize the structure surface. Then, a diffusion prevention film 139, such as a SiN or SiCN film, is formed all over the structure surface.

According to this embodiment, the barrier film 134 containing MnO as the main component is formed while using oxygen present within the etching stop film 126 and coating film 128, which cover the interlevel insulating films 125 and 127. This makes it possible to arbitrarily choose the materials of the interlevel insulating films 125 and 127. For example, as in this embodiment, porous low dielectric constant films are used as the interlevel insulating films 125 and 127 to improve the operation speed of the device.

(Matters Common to the First to Nineteenth Embodiments)

The embodiment described above is exemplified by a case where Cu is used as the material of the interconnection main layer. The interconnection main layer, however, may be made of another material containing Cu as the main component (i.e., by 50% or more), such as a Cu alloy commonly used as an interconnection material. Also in such a case, the same effects as described above can be attained.

The metal element $\alpha$ is not limited to Mn, and it may comprise at least one element selected from the group consisting of Mn, Nb, Zr, Cr, V, Y, Tc, and Re. These metal elements have the following advantages, as compared to Ti and Ta, which are used for conventional barrier films, and Al, Mg, and Sn, which have been proposed by conventional barrier-less process techniques. Specifically, the metal elements listed above for the metal element $\alpha$ can easily form an oxide and the oxide is high in affinity with interlevel insulating films. Accordingly, they can provide a stable oxide layer with uniform quality and very small thickness between an interconnection main layer and an interlevel insulating film. Further, since these elements tend to precipitate or form a compound, rather than staying as solid solution in Cu, they do not increase the interconnection resistance.

The material of interlevel insulating films is not limited to $SiO_2$, and various insulating films may be used. Where an interlevel insulating film contains a Si—O bond group as the main component, such as $SiO_2$, it forms $\alpha_xO_y$ or $\alpha_xSi_yO_z$ by reaction with the metal element $\alpha$. Where an interlevel insulating film contains an organic component, such as C—C, it forms a compound containing this component element by reaction with the metal element $\alpha$. In this latter case, the compound can function as a layer like MnO for preventing Cu diffusion, and provide the same effects as described above.

A method of filling or embedding the Cu film is not limited to a method utilizing electrolytic plating, and it may be a method utilizing CVD, PVD, electroless plating, or film formation using critical liquid. The same effects as described above can be attained by any method, as long as it can embed Cu within a groove and/or a hole formed in an insulating film.

The embodiments described above may be applied to any one of the interconnections from the lowermost level to the uppermost level in a multi-layered interconnection structure disposed on a semiconductor substrate. In this respect, the fourteenth to nineteenth embodiments are exemplified by application to the second level interconnection, but may also be applied to the first level interconnection in the same way.

As an example, FIG. 25 is a sectional view showing a semiconductor device according to a modification of the fourteenth embodiment. Specifically, as shown in FIG. 25, aiming at an impurity diffusion layer (i.e., conductive layer) 40 formed in the surface of a semiconductor substrate Sub, a first level interconnection structure is formed by a method according to the fourteenth embodiment. The first level interconnection structure has a dual damascene interconnection structure, which includes an interlevel insulating film 41-1, a Cu layer 46-1, a MnO barrier film 44-1, and a diffusion prevention film 49-1. Further, aiming at the first level Cu layer 46-1, a second level interconnection structure is formed by a method according to the fourteenth embodiment. The second level interconnection structure has a dual damascene interconnection structure, which includes an interlevel insulating film 41-2, a Cu layer 46-2, a MnO barrier film 44-2, and a diffusion prevention film 49-2.

A multi-layered interconnection structure, as shown in FIG. 25, may be manufactured in the same manner, using any of the other embodiments. If necessary, different embodiments selected from the first to thirteenth embodiments may be respectively applied to different level interconnection structures.

The fourteenth to nineteenth embodiments are exemplified by a case where a dual damascene or single damascene interconnection structure is used. The present invention, however, may be applied to various embedded interconnection structures other than damascene interconnection structures.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an interlevel insulating film disposed on a semiconductor substrate and having an opening formed therein;
   an interconnection main layer embedded in the opening and containing Cu as a main component; and
   a barrier film interposed between the interlevel insulating film and the interconnection main layer within the opening, the barrier film containing, as a main component, a compound of Mn with a component element of the interlevel insulating film.

2. The semiconductor device according to claim 1, wherein the opening is formed to reach a conductive layer disposed below the interlevel insulating film, and the barrier film is not interposed between the conductive layer and the interconnection main layer.

3. The semiconductor device according to claim 1, wherein the opening includes one or both of an interconnection groove and an interconnection hole.

4. The semiconductor device according to claim 1, wherein the barrier film further covers an upper surface of the interconnection main layer.

5. The semiconductor device according to claim 1, wherein the interlevel insulating film comprises O and at least one element selected from the group consisting of Si, C, and F, and the barrier film contains $Mn_xO_y$ as a main component.

6. The semiconductor device according to claim 2, wherein the conductive layer is a lower interconnection layer, and the device further comprises a lower insulating film interposed between the lower interconnection layer and the interlevel insulating film, such that the opening passes through the lower insulating film.

7. The semiconductor device according to claim 6, wherein the lower insulating film contains oxygen at a concentration of 33% or less by atomic percentage.

8. The semiconductor device according to claim 7, wherein the lower insulating film has an oxygen concentration set to be lower on a side facing the lower interconnection layer than on a side facing the interlevel insulating film.

9. The semiconductor device according to claim 6, wherein the lower insulating film contains, as a main component, a material selected from the group consisting of SiC, SiCN, and SiN.

10. The semiconductor device according to claim 2, wherein the conductive layer is a lower interconnection layer, and the device further comprises a refractory metal layer interposed between the lower interconnection layer and the interlevel insulating film.

11. The semiconductor device according to claim 10, wherein the refractory metal layer is further interposed between the lower interconnection layer and the interconnection main layer.

12. The semiconductor device according to claim 10, wherein the refractory metal layer contains, as a main component, a material selected from the group consisting of CoW, CoWB, CoWP, and CuSi.

13. The semiconductor device according to claim 1, wherein the interlevel insulating film comprises a porous low dielectric constant film, and the device further comprises a coating film interposed between the interlevel insulating film and the barrier film and having a higher atomic density than the interlevel insulating film.

14. The semiconductor device according to claim 13, wherein the interlevel insulating film and the coating film contain the same material as a main component.

15. The semiconductor device according to claim 1, wherein the interlevel insulating film comprises O and at least one element selected from the group consisting of Si, C, and F, and the barrier film contains, as a main component, a material selected from the group consisting of $Mn_xSi_yO_z$, $Mn_xC_yO_z$, and $Mn_xF_yO_z$.

* * * * *